(12) United States Patent
Fukaya et al.

(10) Patent No.: US 7,108,592 B2
(45) Date of Patent: Sep. 19, 2006

(54) SUBSTRATE HOLDING APPARATUS AND POLISHING APPARATUS

(75) Inventors: Koichi Fukaya, Tokyo (JP); Tetsuji Togawa, Tokyo (JP); Hiroshi Yoshida, Tokyo (JP); Osamu Nabeya, Tokyo (JP); Makoto Fukushima, Tokyo (JP)

(73) Assignee: Ebara Corporation, Tokyo (JP)

( * ) Notice: Subject to any disclaimer, the term of this patent is extended or adjusted under 35 U.S.C. 154(b) by 196 days.

(21) Appl. No.: 10/874,317

(22) Filed: Jun. 24, 2004

(65) Prior Publication Data
US 2005/0028931 A1 Feb. 10, 2005

(30) Foreign Application Priority Data
Jun. 24, 2003 (JP) ............................. 2003-180044

(51) Int. Cl.
*B24B 29/00* (2006.01)
*B24B 47/02* (2006.01)

(52) U.S. Cl. .................. 451/285; 451/287; 451/288; 451/398

(58) Field of Classification Search ................. 451/41, 451/285, 287, 397, 398, 288
See application file for complete search history.

(56) References Cited

U.S. PATENT DOCUMENTS

| | | | |
|---|---|---|---|
| 5,908,347 A | | 6/1999 | Nakajima et al. |
| 6,293,858 B1 | * | 9/2001 | Kimura et al. ............... 451/287 |
| 6,336,851 B1 | * | 1/2002 | Shendon ..................... 451/303 |
| 6,367,529 B1 | | 4/2002 | Yanagisawa |
| 6,514,124 B1 | | 2/2003 | Zuniga et al. |
| 6,612,903 B1 | | 9/2003 | Korovin et al. |
| 6,652,368 B1 | | 11/2003 | Shendon et al. |
| 6,719,618 B1 | * | 4/2004 | Homma et al. ............. 451/286 |
| 6,746,312 B1 | | 6/2004 | Torii et al. |

* cited by examiner

*Primary Examiner*—Eileen P. Morgan
(74) *Attorney, Agent, or Firm*—Wenderoth, Lind & Ponack, L.L.P.

(57) ABSTRACT

The present invention relates to a substrate holding apparatus for holding a substrate such as a semiconductor wafer in a polishing apparatus for polishing the substrate to a flat finish. The substrate holding apparatus includes a vertically movable top ring body for holding the substrate, and an elastic membrane for defining a pressure chamber in the top ring body. A coating is applied to a surface of the elastic membrane which is brought into contact with the substrate.

17 Claims, 16 Drawing Sheets

SUBSTRATE HOLDING APPARATUS AND POLISHING APPARATUS

BACKGROUND OF THE INVENTION

1. Field of the Invention

The present invention relates to a substrate holding apparatus for holding a substrate to be polished and pressing the substrate against a polishing surface, and more particularly to a substrate holding apparatus for holding a substrate such as a semiconductor wafer in a polishing apparatus for polishing the substrate to a flat finish. The present invention also relates to a polishing apparatus having such a substrate holding apparatus.

2. Description of the Related Art

In recent years, semiconductor devices have become smaller in size and structures of semiconductor elements have become more complicated. In addition, the number of layers in multilayer interconnects used for a logical system has been increased. Accordingly, irregularities on a surface of a semiconductor device become increased, and hence step heights on the surface of the semiconductor device tend to be larger. This is because, in a manufacturing process of a semiconductor device, a thin film is formed on a semiconductor device, then micromachining processes, such as patterning or forming holes, are performed on the semiconductor device, and these processes are repeated many times to form subsequent thin films on the semiconductor device.

When the number of irregularities on a surface of a semiconductor device is increased, a thickness of a thin film formed on a portion having a step tends to be small. Further, an open circuit is caused by disconnection of interconnects, or a short circuit is caused by insufficient insulation between interconnect layers. As a result, good products cannot be obtained, and the yield tends to be reduced. Furthermore, even if a semiconductor device initially works normally, reliability of the semiconductor device is lowered after a long-term use. At the time of exposure in a lithography process, if a surface to be irradiated has irregularities, then a lens unit in an exposure system cannot focus on such irregularities. Therefore, if the irregularities of the surface of the semiconductor device are increased, then it becomes difficult to form a fine pattern on the semiconductor device.

Accordingly, in a manufacturing process of a semiconductor device, it becomes increasingly important to planarize a surface of a semiconductor device. The most important one of the planarizing technologies is CMP (Chemical Mechanical Polishing). Chemical mechanical polishing is performed with use of a polishing apparatus. Specifically, a substrate such as a semiconductor wafer is brought into sliding contact with a polishing surface such as a polishing pad while a polishing liquid containing abrasive particles such as silica ($SiO_2$) is supplied onto the polishing surface, so that the substrate is polished.

This type of polishing apparatus comprises a polishing table having a polishing surface constituted by a polishing pad, and a substrate holding apparatus, called a top ring or a carrier head, for holding a semiconductor wafer. A semiconductor wafer is polished by the polishing apparatus as follows: The semiconductor wafer is held by the substrate holding apparatus and then pressed against the polishing table under a predetermined pressure. At this time, the polishing table and the substrate holding apparatus are moved relative to each other for thereby bringing the semiconductor wafer into sliding contact with the polishing surface. Accordingly, the surface of the semiconductor wafer is polished to a flat mirror finish.

In such a polishing apparatus, if a relative pressing force between the semiconductor wafer being polished and the polishing surface of the polishing pad is not uniform over an entire surface of the semiconductor wafer, then the semiconductor wafer may be insufficiently be polished or may excessively be polished at some portions depending on the pressing force applied to those portions of the semiconductor wafer. In order to avoid such a drawback, it has been attempted to form a surface, for holding a semiconductor wafer, of a substrate holding apparatus with use of an elastic membrane (membrane) made of an elastic material such as rubber and apply a fluid pressure such as an air pressure to a backside surface of the elastic membrane so as to uniform a pressing force applied to the semiconductor wafer over an entire surface of the semiconductor wafer. In this case, the elastic membrane is made of ethylene propylene rubber (EPDM), polyurethane rubber, fluororubber, or the like.

As described above, in the so-called floating-type substrate holding apparatus in which a holding surface for holding a semiconductor wafer is formed by an elastic membrane, since the semiconductor wafer is pressed by the elastic membrane, the elastic membrane and the semiconductor wafer are brought into close contact with each other. Thus, after polishing of the semiconductor wafer is finished, when the semiconductor wafer is removed from the substrate holding apparatus, the semiconductor wafer is difficult to be detached from the elastic membrane. In this case, if the semiconductor wafer is forced to be detached from the elastic membrane, then the semiconductor wafer is possibly damaged or broken. Further, the hardness of the elastic membrane is made low so that the elastic membrane can press the semiconductor wafer up to the outer peripheral portion of the semiconductor wafer, and hence the degree of adhesion between the elastic membrane and the semiconductor wafer is further increased. Thus, the semiconductor wafer is more difficult to be detached from the elastic membrane.

SUMMARY OF THE INVENTION

The present invention has been made in view of the above conventional problems. It is therefore an object of the present invention to provide a substrate holding apparatus which has a holding surface for holding a substrate such as a semiconductor wafer formed by an elastic membrane (membrane) and can easily detach the substrate from the elastic membrane (membrane) to remove the substrate reliably after polishing of the substrate is finished, and to provide a polishing apparatus incorporating such a substrate holding apparatus.

In order to achieve the above object, according to the present invention, there is provided a substrate holding apparatus for holding a substrate and pressing the substrate against a polishing surface, comprising: a vertically movable top ring body for holding the substrate; and an elastic membrane for defining a pressure chamber in the top ring body; wherein a coating is applied to a surface of the elastic membrane which is brought into contact with the substrate.

According to the present invention, since the coating is applied to the surface, which contacts the substrate, of the elastic membrane for pressing the substrate against the polishing surface during polishing, in adhesion and sliding properties of the elastic membrane are enhanced. When the substrate is releasded from the substrate holding apparatus after polishing of the substrate is finished, the substrate can be easily detached from the elastic membrane, and the substrate can be reliably removed from the substrate holding apparatus.

According to one aspect of the present invention, a cutout is formed in the elastic membrane, and the coating is not applied to a portion surrounding the cutout.

According to the present invention, since the coating is not applied to the portion surrounding the cutout (or opening) formed in the elastic membrane, the sealing between the substrate and the elastic membrane can be reliably maintained during polishing of the substrate.

According to one aspect of the present invention, the coating is not applied to an outermost circumferential portion of the elastic membrane or a portion close to the outermost circumferential portion.

According to the present invention, since the coating is not applied to the outermost circumferential portion of the elastic membrane or the portion close to the outermost circumferential portion of the membrane which corresponds to the location for performing a torque transmission from the top ring to the substrate, the torque transmission from the top ring to the substrate can be reliably performed.

According to one aspect of the present invention, the pressure chamber defined in the top ring body is divided into a plurality of annular pressure chambers, and the elastic membrane comprises a plurality of annular elastic membranes for covering the plurality of annular pressure chambers.

According to one aspect of the present invention, of the plurality of annular elastic membranes, a coating is not applied to the annular elastic membrane located at an outer circumferential side of the top ring body, but the coating is applied only to the annular elastic membrane located at an inner circumferential side of the top ring body.

According to the present invention, when the substrate is released from the substrate holding apparatus after polishing of the substrate is finished, since the impregnation coating is applied to the portion which tends to adhere to the substrate, the substrate can be easily detached from the elastic membrane. Further, since the coating is not applied to the outer circumferential portion of the elastic membrane which transmits a torque from the top ring body to the substrate during polishing of the substrate, the torque transmission from the top ring body to the substrate can be reliably performed.

According to one aspect of the present invention, a coating is applied to a backside surface of the elastic membrane which is not brought into contact with the substrate.

According to the present invention, since the coating is applied to the reverse surface of the elastic membrane which is not brought into contact with the substrate, slurry or dust particles can be prevented from being attached to the elastic membrane, and the elastic membrane can be prevented from adhering to a member such as a chucking plate which constitutes part of the top ring. Further, even if an elastic membrane is located at the reverse side of the elastic membrane, the elastic membranes which face each other can be prevented from adhering to each other.

According to one aspect of the present invention, a film of the coating comprises fluororesin.

According to one aspect of the present invention, the coating comprises an impregnation coating.

According to the present invention, since a resin comprising impregnation fluororesin or the like is entangled with an elastic membrane material, even if the elastic membrane is deformed during polishing of the substrate, the resin is prevented from being peeled off.

According to the present invention, there is provided a polishing apparatus comprising: a polishing table having a polishing surface; and a substrate holding apparatus for holding a substrate and pressing the substrate against the polishing surface; the substrate holding apparatus comprising: a vertically movable top ring body for holding the substrate; and an elastic membrane for defining a pressure chamber in the top ring body, wherein a coating is applied to a surface of the elastic membrane which is brought into contact with the substrate.

According to one aspect of the present invention, the polishing surface comprises a polishing pad or a fixed abrasive.

BRIEF DESCRIPTION OF THE DRAWINGS

FIG. 3A is an enlarged cross-sectional view showing the top ring shown in FIG. 2 and FIG. 3B is a schematic view of the portion A of FIG. 3A showing the state in which the impregnation coating is applied to the membrane;

FIG. 4A is an enlarged cross-sectional view showing the top ring shown in FIG. 2 and FIG. 4B is a plan view showing the surface (substrate holding surface) of the membrane;

FIG. 5A is a view showing the state of the coating in which fluororesin is densely distributed and FIG. 5B is a view showing a state of the coating in which fluororesin is coarsely distributed;

FIG. 17A is an enlarged cross-sectional view of a top ring and FIG. 17B is a bottom plan view of the top ring incorporating an intermediate air bag comprising an elastic membrane to which an impregnation coating is applied;

FIG. 18A is an enlarged cross-sectional view of a top ring and FIG. 18B is a bottom plan view of the top ring incorporating an intermediate air bag comprising an elastic membrane to which an impregnation coating is applied; FIG. 19A is an enlarged cross-sectional view of a top ring and FIG. 19B is a bottom plan view of the top ring incorporating an intermediate air bag comprising an elastic membrane to which an impregnation coating is applied.

DETAILED DESCRIPTION OF THE PREFERRED EMBODIMENTS

A substrate holding apparatus and a polishing apparatus according to embodiments of the present invention will be described in detail below with reference to the drawings.

Figure 1:
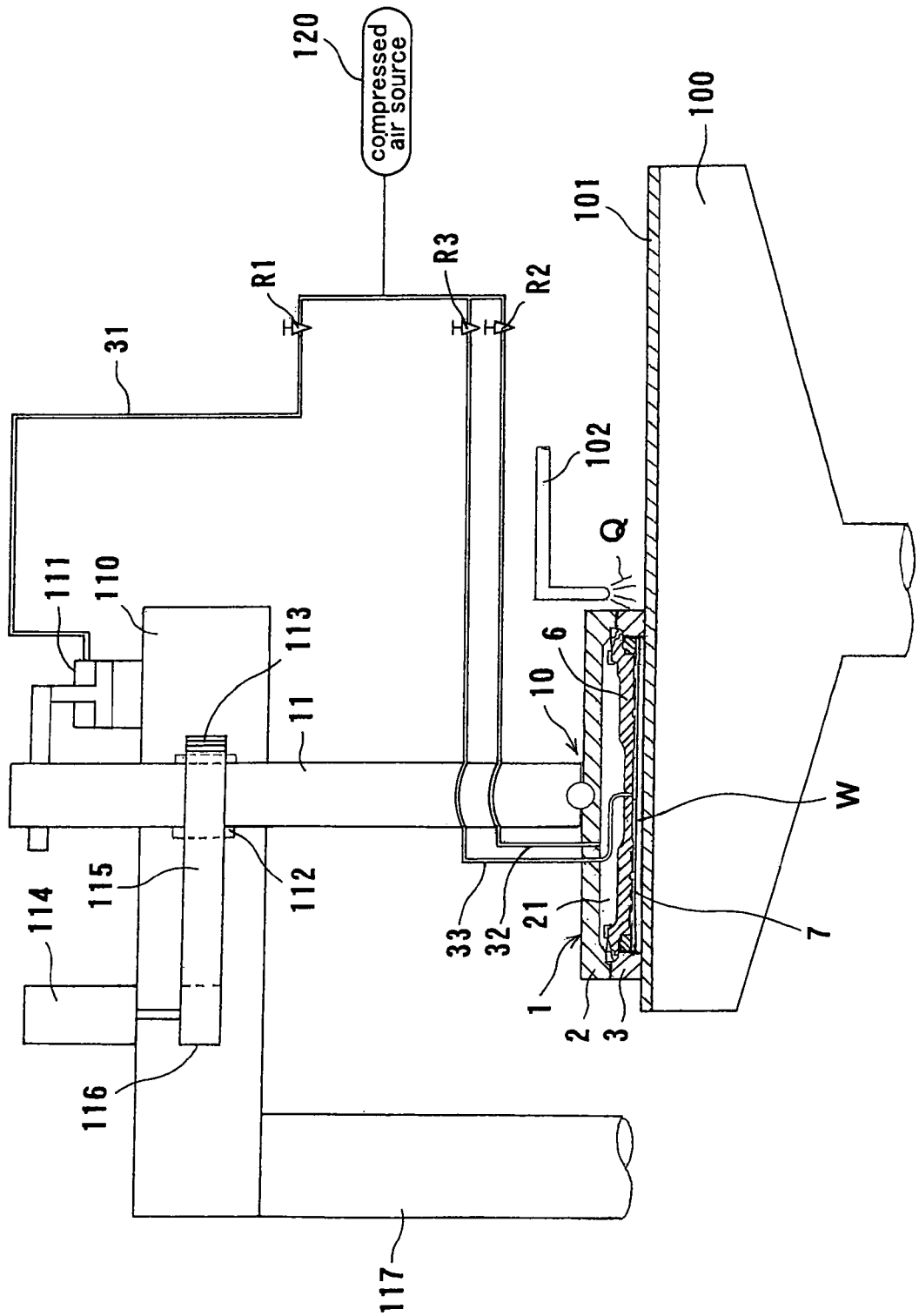
FIG. 1 is a cross-sectional view showing an overall arrangement of a polishing apparatus incorporating a substrate holding apparatus according to an embodiment of the present invention.

FIG. 1 is a cross-sectional view showing an entire arrangement of a polishing apparatus having a substrate holding apparatus according to the present invention. The substrate holding apparatus serves to hold a substrate such as a semiconductor wafer to be polished and to press the substrate against a polishing surface on a polishing table. As shown in FIG. 1, the polishing table 100 having a polishing pad 101 attached to an upper surface thereof is provided underneath a top ring 1 constituting a substrate holding apparatus according to the present invention. A polishing liquid supply nozzle 102 is provided above the polishing table 100, and a polishing liquid Q is supplied onto the polishing pad 101 on the polishing table 100 from the polishing liquid supply nozzle 102.

Various kinds of polishing pads are available on the market. For example, some of these are SUBA800, IC-1000, and IC-1000/SUBA400 (two-layer cloth) manufactured by Rodel, Inc., and Surfin xxx-5 and Surfin 000 manufactured by Fujimi Inc. SUBA800, Surfin xxx-5, and Surfin 000 are non-woven fabrics bound by urethane resin, and IC-1000 is made of rigid foam polyurethane (single-layer). Foam polyurethane is porous and has a large number of fine recesses or holes formed in its surface.

Although the polishing pad serves as the polishing surface, the present invention is not limited to the above structure. For example, the polishing surface may be constituted by a fixed abrasive. The fixed abrasive is formed into a flat plate comprising abrasive particles fixed by a binder. With the fixed abrasive for polishing, the polishing process is performed by abrasive particles that are self-generated from the fixed abrasive. The fixed abrasive comprises abrasive particles, a binder, and pores. For example, cerium dioxide ($CeO_2$) or silicon oxide ($SiO_2$) or alumina ($Al_2O_3$) having an average particle diameter of 0.5 μm or less is used as an abrasive particle, and thermosetting resin such as epoxy resin or phenol resin or thermoplastic resin such as MBS resin or ABS resin is used as a binder. Such a fixed abrasive forms a harder polishing surface. The fixed abrasive includes a fixed abrasive pad having a two-layer structure formed by a thin layer of a fixed abrasive and an elastic polishing pad attached to a lower surface of the thin layer of the fixed abrasive.

As sown in FIG. 1, the top ring 1 is connected to a top ring drive shaft 11 by a universal joint 10, and the top ring drive shaft 11 is coupled to a top ring air cylinder 111 fixed to a top ring head 110. The top ring air cylinder 111 operates to move the top ring drive shaft 11 vertically to thereby lift and lower the top ring 1 as a whole and to press a retainer ring 3 fixed to a lower end of a top ring body 2 against the polishing pad 101 on the polishing table 100.

The top ring air cylinder 111 is connected to a compressed air source 120 via a fluid passage 31 and a regulator R1. The regulator R1 can regulate pressure of compressed air or the like which is supplied to the top ring air cylinder 111. Thus, it is possible to adjust a pressing force to press the polishing pad 101 with the retainer ring 3.

The top ring drive shaft 11 is connected to a rotary sleeve 112 by a key (not shown). The rotary sleeve 112 has a timing pulley 113 fixedly disposed at a peripheral portion thereof. A top ring motor 114 is fixed to the top ring head 110, and the timing pulley 113 is coupled to a timing pulley 116 mounted on the top ring motor 114 via a timing belt 115. Therefore, when the top ring motor 114 is energized for rotation, the rotary sleeve 112 and the top ring drive shaft 11 are rotated in unison with each other via the timing pulley 116, the timing belt 115, and the timing pulley 113 to thereby rotate the top ring 1. The top ring head 11O is supported on a top ring head shaft 117 rotatably supported on a frame (not shown).

Figure 2:
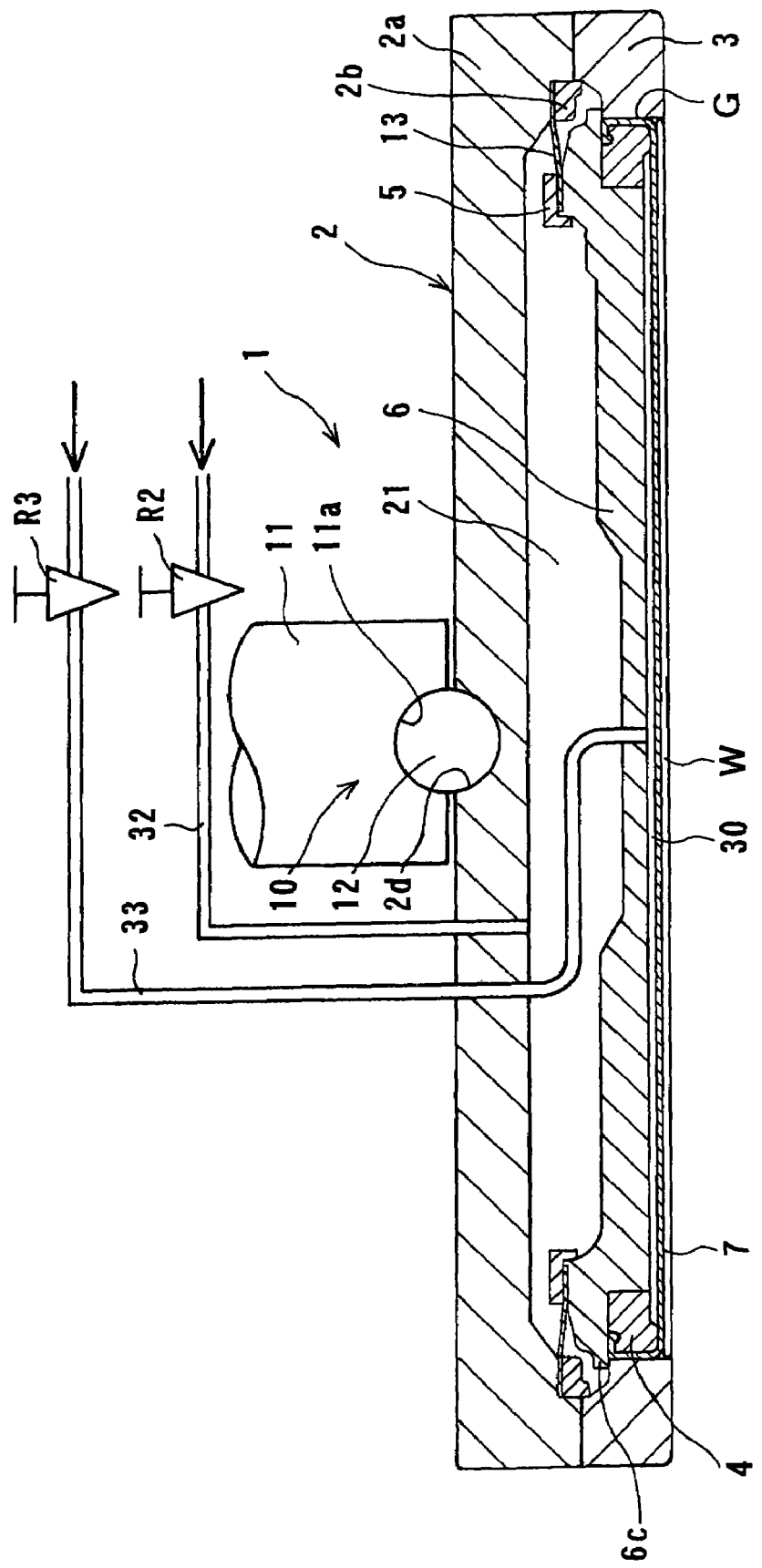
FIG. 2 is a vertical cross-sectional view of a top ring according to the first embodiment of the present invention.

Next, the top ring 1 constituting a substrate holding apparatus according to the present invention will be described below in detail. FIG. 2 is a vertical cross-sectional view showing the top ring according to a first embodiment of the present invention.

As shown in FIG. 2, the top ring 1 constituting a substrate holding apparatus comprises a top ring body 2 in the form of a cylindrical housing with a receiving space defined therein, and an annular retainer ring 3 fixed to the lower end of the top ring body 2. The top ring body 2 is made of a material having high strength and rigidity, such as metal or ceramics. The retainer ring 3 is made of highly rigid synthetic resin, ceramics, or the like.

The top ring body 2 comprises a cylindrical housing 2a and an annular pressurizing sheet support 2b fitted into a cylindrical portion of the housing 2a. The retainer ring 3 is fixed to the lower end of the housing 2a of the top ring body 2. The retainer ring 3 has a lower portion projecting radially inwardly. The retainer ring 3 may be formed integrally with the top ring body 2.

The top ring drive shaft 11 is disposed above the central portion of the housing 2a of the top ring body 2, and the top ring body 2 is coupled to the top ring drive shaft 11 by the universal joint 10. The universal joint 10 has a spherical bearing mechanism by which the top ring body 2 and the top ring drive shaft 11 are tiltable with respect to each other, and a rotation transmitting mechanism for transmitting the rotation of the top ring drive shaft 11 to the top ring body 2. The spherical bearing mechanism and the rotation transmitting mechanism transmit a pressing force and a rotating force from the top ring drive shaft 11 to the top ring body 2 while allowing the top ring body 2 and the top ring drive shaft 11 to be tilted with respect to each other.

The spherical bearing mechanism comprises a hemispherical concave recess 11a defined centrally in the lower surface of the top ring drive shaft 11, a hemispherical concave recess 2d defined centrally in the upper surface of the housing 2a, and a bearing ball 12 made of a highly hard material such as ceramics and interposed between the concave recesses 11a and 2d. On the other hand, the rotation transmitting mechanism comprises drive pins (not shown) fixed to the top ring drive shaft 11, and driven pins (not shown) fixed to the housing 2a. Even if the top ring body 2 is tilted with respect to the top ring drive shaft 11, the drive pins and the driven pins remain in engagement with each other while contact points are displaced because the drive pin and the driven pins are vertically movable relative to each other. Thus, the rotation transmitting mechanism reliably transmits rotational torque of the top ring drive shaft 11 to the top ring body 2.

The top ring body 2 and the retainer ring 3 secured to the top ring body 2 have a space defined therein, which accommodates therein an annular holder ring 5, and a disk-shaped chucking plate 6 (vertically movable member) which is vertically movable within the receiving space in the top ring body 2. The chucking plate 6 may be made of metal. However, when the thickness of a thin film formed on a surface of a semiconductor wafer is measured by a method using eddy current in such a state that the semiconductor wafer to be polished is held by the top ring, the chucking plate 6 should preferably be made of a non-magnetic material, e.g., an insulating material such as epoxy glass, fluororesin, or ceramic.

A pressurizing sheet 13 comprising an elastic membrane extends between the holder ring 5 and the top ring body 2. The pressurizing sheet 13 has a radially outer edge clamped between the housing 2a and the pressurizing sheet support 2b of the top ring body 2, and a radially inner edge clamped between an upper end portion of the chucking plate 6 and the holder ring 5. The top ring body 2, the chucking plate 6, the holder ring 5, and the pressurizing sheet 13 jointly define a pressure chamber 21 in the top ring body 2. As shown in FIG. 2, a fluid passage 32 comprising tubes and connectors communicates with the pressure chamber 21, and the pressure chamber 21 is connected to the compressed air source 120 through the regulator R2 provided in the fluid passage 32 (see FIG. 1). The pressurizing sheet 13 is made of highly strong and durable rubber material such as ethylene propylene rubber (EPDM), polyurethane rubber, or silicone rubber.

In a case where the pressurizing sheet 13 is made of an elastic material such as rubber, if the pressurizing sheet 13 is fixedly clamped between the retainer ring 3 and the top ring body 2, then a desired horizontal surface cannot be maintained on the lower surface of the retainer ring 3 because of elastic deformation of the pressurizing sheet 13 as an elastic material. In order to prevent such a drawback, the pressurizing sheet 13 is clamped between the housing 2a of the top ring body 2 and the pressurizing sheet support 2b provided as a detach member in the present embodiment.

The retainer ring 3 may vertically be movable with respect to the top ring body 2, or the retainer ring 3 may have a structure capable of pressing the polishing surface independently of the top ring body 2. In such cases, the pressurizing sheet 13 is not necessarily fixed in the aforementioned manner.

An annular membrane (elastic membrane) 7 held in contact with a substantially entire reverse surface of the semiconductor wafer W held by the top ring 1 is mounted on the outer circumference edge of the chucking plate 6. The membrane 7 has an upper end sandwiched between the outer circumference edge of the chucking plate 6 and the annular edge ring 4. In this manner, the membrane 7 is mounted on the chucking plate 6.

As shown in FIG. 2, when the semiconductor wafer W is held by the top ring 1, a pressure chamber 30 is defined in the membrane 7. A fluid passage 33 comprising tubes and connectors communicates with the pressure chamber 30, and the pressure chamber 30 is connected to the compressed air source 120 through the regulator R3 provided in the fluid passage 33. The membrane (elastic membrane) 7 is made of a highly strong and durable rubber material such as ethylene propylene rubber (EPDM), polyurethane rubber, or silicone rubber, as with the pressurizing sheet 13. The rubber material of the membrane 7 should preferably have a hardness (duro) ranging from 20 to 70.

According to the present invention, an impregnation coating of a fluororesin is applied to the surface of the membrane (elastic membrane) 7. Specifically, the impregnation coating is applied to the surface of the membrane (elastic membrane) 7 which is brought into contact with the semiconductor W. In adhesion and sliding properties of the membrane (elastic membrane) 7 are enhanced by the impregnation coating, and hence the semiconductor wafer can be easily detached from the membrane (elastic membrane) 7. Thus, the semiconductor wafer can be easily released from the top ring 1. Further, the impregnation coating serves to prevent a slurry or dust particles from being attached to the membrane (elastic membrane) 7. Furthermore, wear-resistant properties of the membrane can be enhanced by the impregnation coating, and hence a service life of the membrane is prolonged.

Figure 3A:
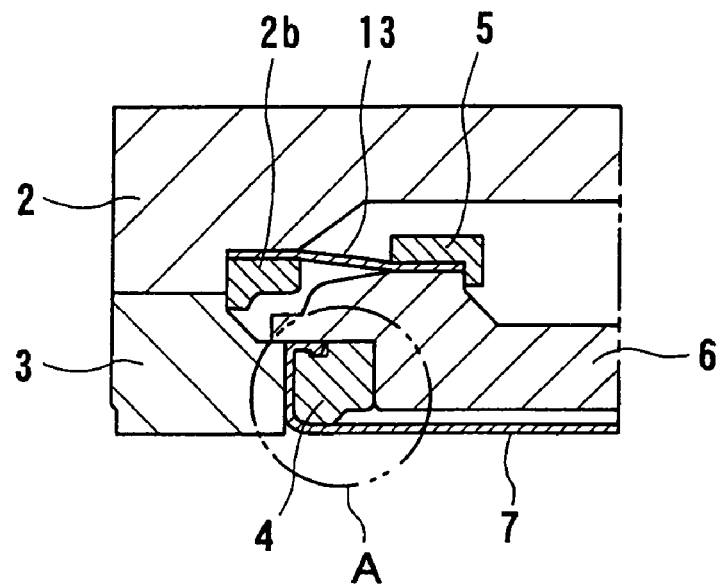
FIGS. 3A and 3B are views showing the state in which an impregnation coating of fluororesin is applied to a membrane (elastic membrane)
Figure 3B:
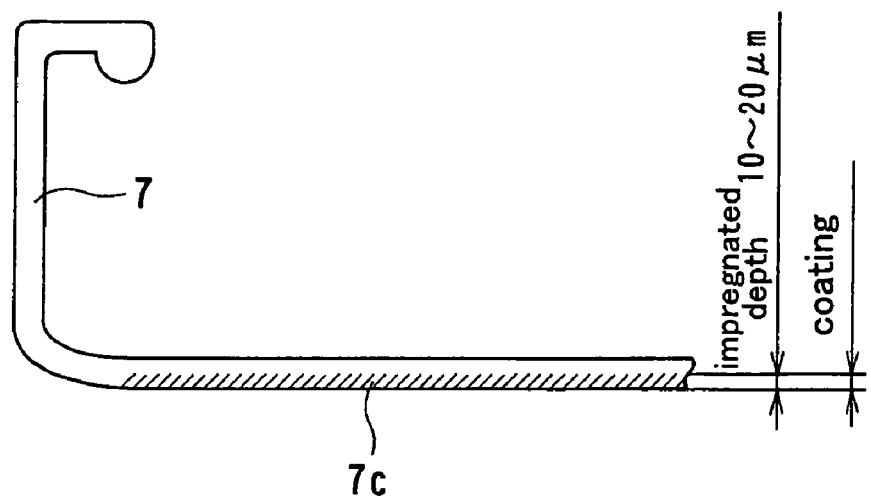

FIGS. 3A and 3B are schematic views showing the state in which an impregnation coating of fluororesin is applied to a membrane (elastic membrane) 7, and FIG. 3A is an enlarged cross-sectional view showing the top ring shown in FIG. 2 and FIG. 3B is a schematic view of the portion A of FIG. 3A showing the state in which the impregnation coating is applied to the membrane. As shown in FIG. 3B, an impregnation coating 7c made of fluororesin is applied to the surface (substrate holding surface) of the membrane (elastic membrane) 7. The impregnated depth of the fluororesin into the membrane is in the range of 10 to 20 μm, and the thickness of the fluororesin coated on the surface of the membrane is about 10 μm. Besides the fluororesin impregnation coating, a fluororesin surface coating or a ceramic coating may be applied to the surface of the membrane (elastic membrane). With the fluororesin surface coating, since fluororesin is coated on the membrane (elastic membrane), the fluororesin tends to come off the membrane during polishing of the semiconductor wafer W. Further, with a ceramic coating, the surface of the membrane is hardened and the membrane (elastic membrane) tends to lose elasticity. Therefore, the impregnation coating is most preferable in the floating-type substrate holding apparatus. By applying the impregnation coating to the membrane, the membrane is impregnated with fluororesin, and a material of the membrane (elastic membrane) and the fluororesin are entangled with each other. Thus, even if the membrane (elastic membrane) is deformed during polishing of the semiconductor wafer, the fluororesin hardly comes off the membrane (elastic membrane).

As described above, by applying the coating to the membrane (elastic membrane), non-adhesion is enhanced and sliding properties are enhanced. In view of a torque transmission from the top ring to the semiconductor wafer, it is desirable that the coating should not be applied to a main part of the membrane which performs the torque transmission.

Figure 4A:
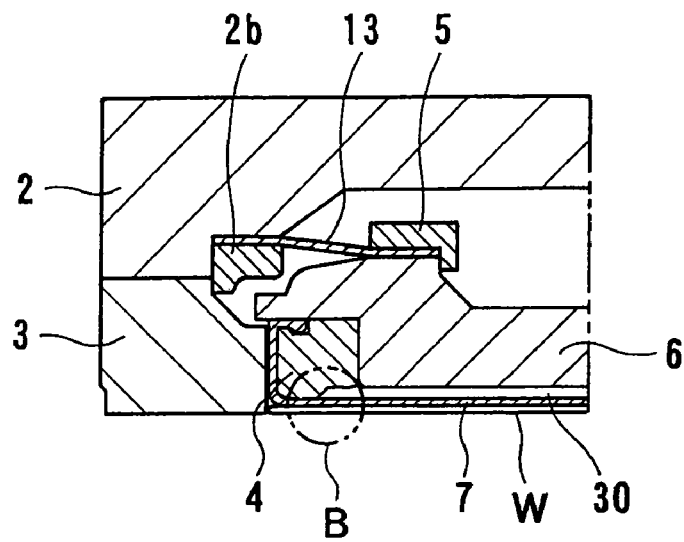
FIGS. 4A and 4B are views showing the location where a coating should not be applied.
Figure 4B:
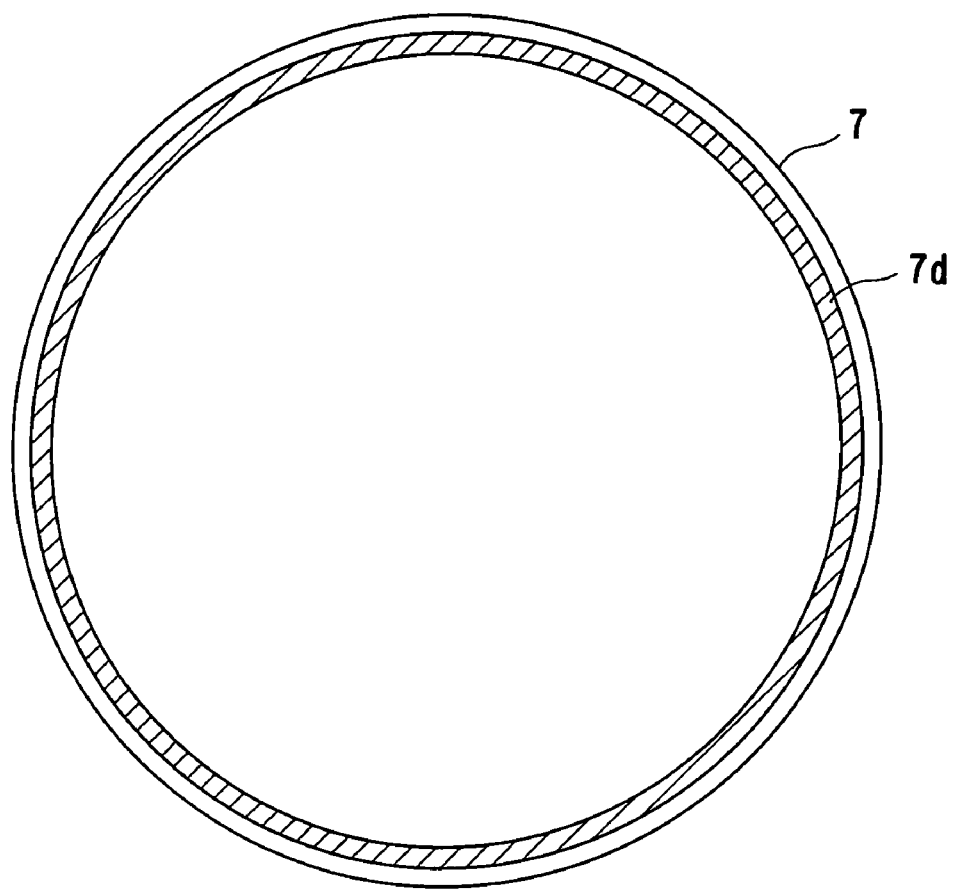

FIGS. 4A and 4B are schematic views showing the location where a coating should not be applied, and FIG. 4A is an enlarged cross-sectional view of the top ring shown in FIG. 2 and FIG. 4B is a plan view showing the surface (substrate holding surface) of the membrane. As shown in FIG. 4B, the location (shown by hatched portion) 7d to which a coating should not be applied corresponds to the location below the edge ring 4 in the portion B of FIG. 4A, and it is assumed that the torque transmission is mainly performed by this location. Specifically, since the outermost part of the membrane 7 or the part close to the outermost part of the membrane 7 serves to perform the torque transmission to the semiconductor wafer W, it is desirable that a coating should not be applied to such part.

FIGS. 5A and 5B through 12 are views showing a single membrane having a substrate holding surface to which a coating is applied, respectively. The membranes (elastic membranes) shown in FIGS. 5A and 5B through 12 are all integral-type membranes.

Figure 5A:
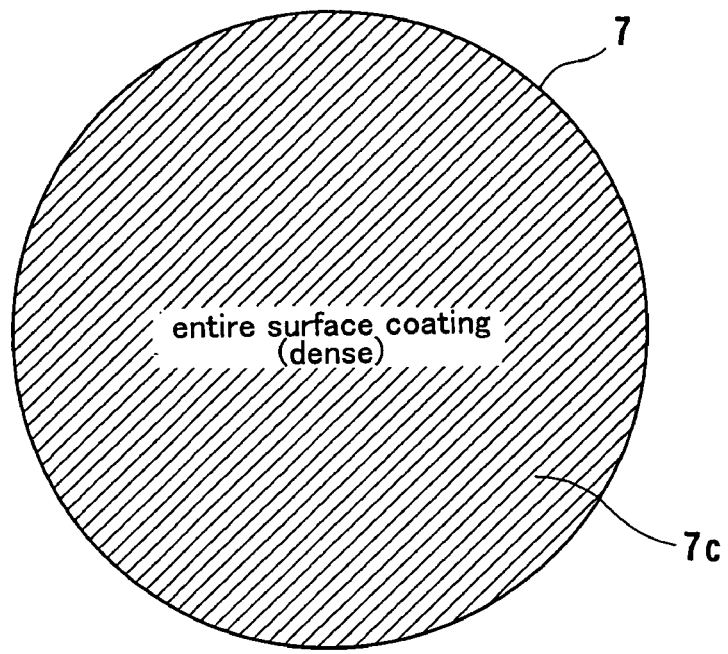
FIGS. 5A and 5B are views of membranes (elastic membranes) to which a coating is applied over the entire surfaces thereof.
Figure 5B:
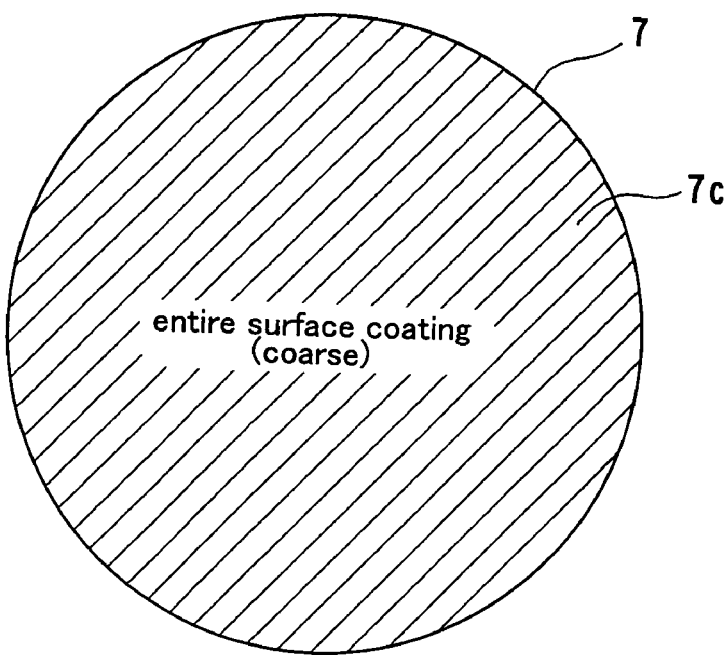

FIGS. 5A and 5B are views showing membranes (elastic membranes) 7 to which an impregnation coating 7c is applied over the entire surfaces thereof, and the impregnation coatings shown in FIGS. 5A and 5B have different fluororesin content distributions. In the coating shown in FIG. 5A, the fluororesin is densely distributed, and in the coating shown in FIG. 5B, the fluororesin is coarsely distributed. It is desirable to use the membrane (elastic membrane) 7 shown in FIG. 5A and the membrane (elastic membrane) shown in FIG. 5B properly according to a specific process. The membrane (elastic membrane) shown in FIG. 5A is used for a low load process with respect to the membrane (elastic membrane), and the membrane (elastic membrane) 7 shown in FIG. 5B is used for a high load process with respect to the membrane (elastic membrane).

Figure 6:
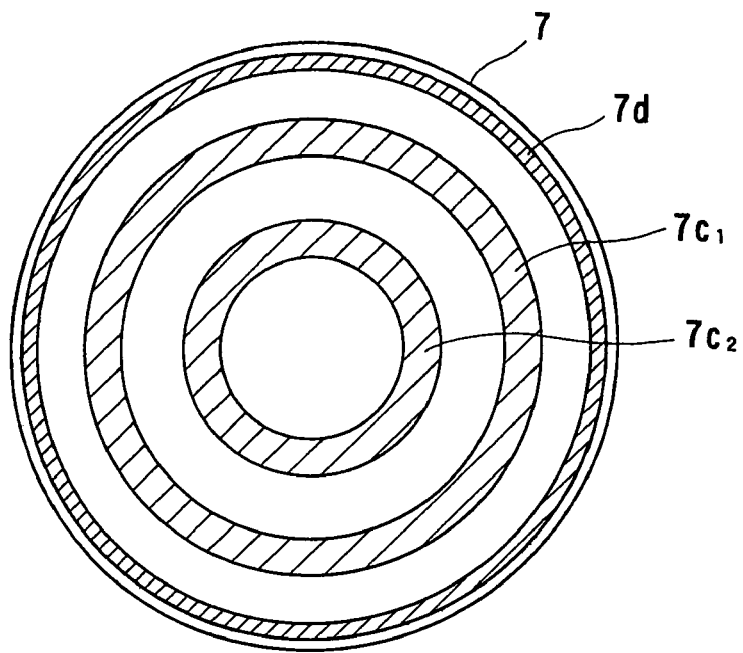
FIG. 6 is a view of a membrane (elastic membrane) in which a coating is not applied to the outermost hatched portion and an impregnation coating is applied to the inner hatched portions.

FIG. 6 is a view showing a membrane (elastic membrane) in which a coating is not applied to a hatched portion 7d of the membrane located at the outermost part of the membrane or the part close to the outermost part of the membrane and impregnation coatings 7c1 and 7c2 are applied to inner hatched portions. As shown in FIG. 6, the locations to which the impregnation coatings 7c1 and 7c2 are applied correspond to respective zones of the top ring 1 for controlling the profile of the semiconductor wafer. Specifically, the membrane shown in FIG. 6 is used for the top ring which has a plurality of annular pressure chambers which are divided and located above the membrane, and the impregnation coatings 7c1 and 7c2 correspond to the locations of the different annular pressure chambers, respectively. Pressurized fluids having different pressures are supplied to the respective annular pressure chambers so that pressures of the annular zones can be controlled. Torque transmission from the top ring 1 to semiconductor wafer W is mainly performed by the outer area (hatched portion 7d) to which a coating is not applied. As to releasing of the semiconductor wafer W, the semiconductor wafer W starts to be detached from the membrane (elastic membrane) 7 at the locations to which the impregnation coatings 7c1 and 7c2 are applied.

Figure 7:
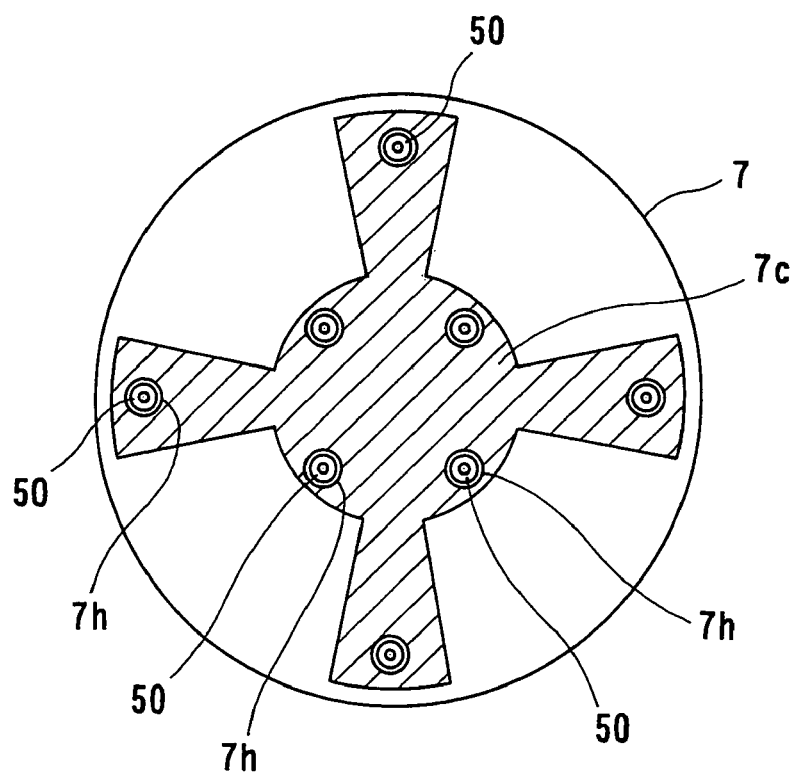
FIG. 7 is a view of a membrane (elastic membrane) in which an impregnation coating is applied to the central portion and cruciform portions extending radially from the central portion.
Figure 8:
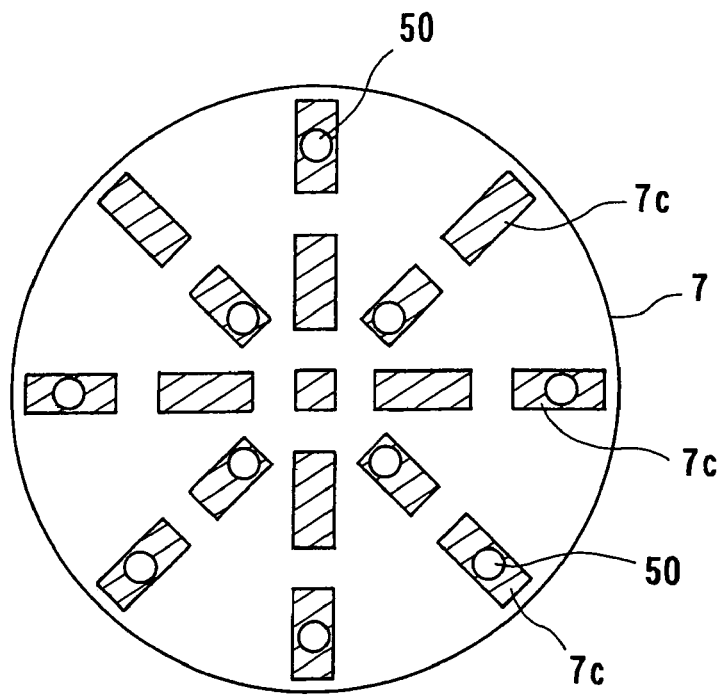
FIG. 8 is a view of a membrane (elastic membrane) in which an impregnation coating is applied to the portions which are arranged radially from the central part to the peripheral part of the membrane (elastic membrane)
Figure 9:
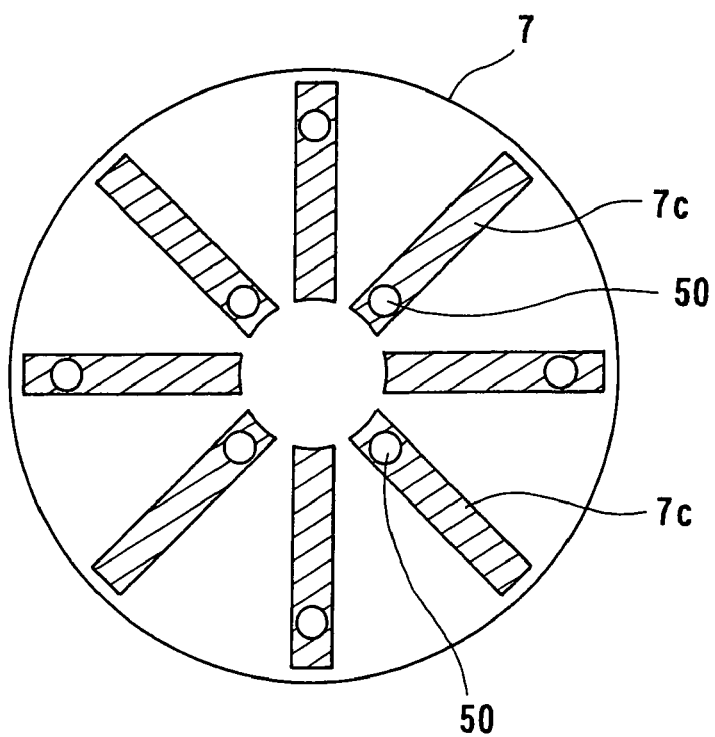
FIG. 9 is a view is a membrane (elastic membrane) in which an impregnation coating is applied to the portions which are arranged radially from the central part to the peripheral part of the membrane (elastic membrane)
Figure 10:
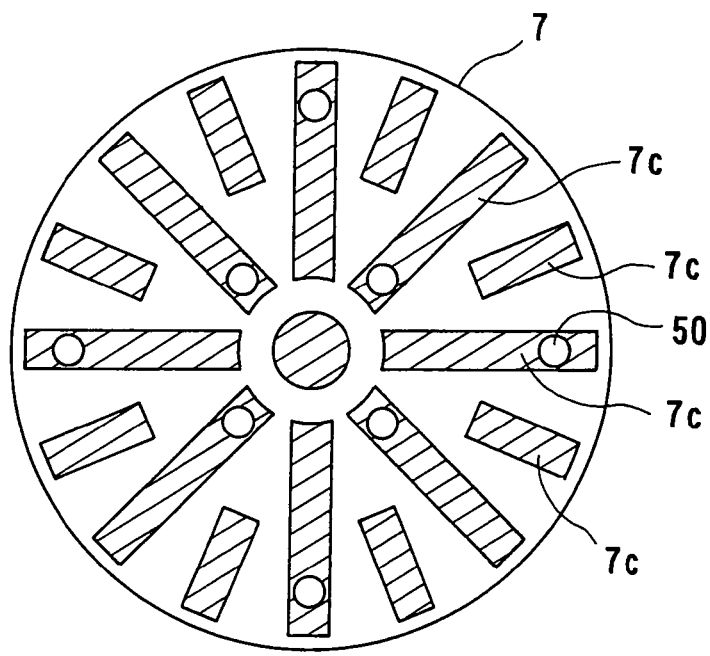
FIG. 10 is a view of a membrane (elastic membrane) in which an impregnation coating is applied to the portions which are arranged radially from the central part to the peripheral part of the membrane (elastic membrane)
Figure 11:
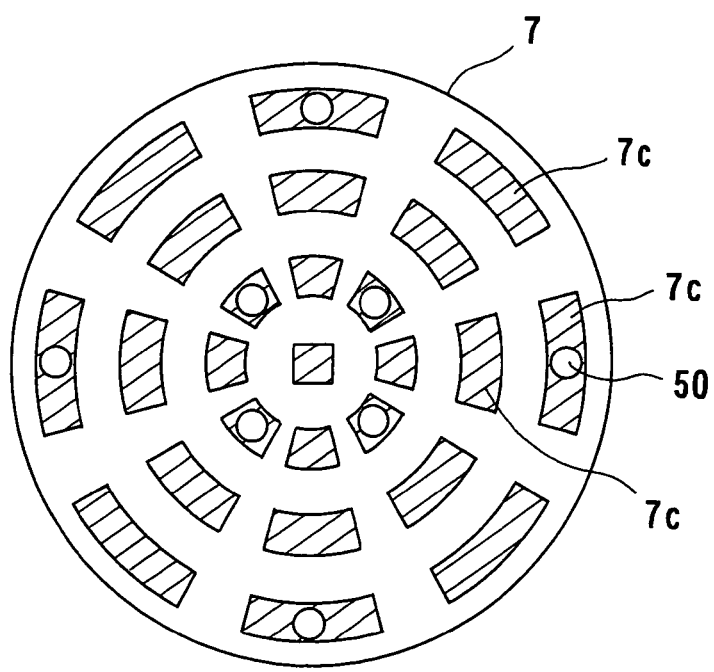
FIG. 11 is a view of a membrane (elastic membrane) in which an impregnation coating is applied to the portions which are arranged radially from the central part to the peripheral part of the membrane (elastic membrane)

FIG. 7 is a view showing a membrane (elastic membrane) 7 in which an impregnation coating 7c is applied to the central portion and the cruciform portions extending radially from the central portion. In the membrane 7 shown in FIG. 7, the impregnation coating 7c is applied to the membrane 7 so that the semiconductor wafer W starts to be detached from the membrane (elastic membrane) 7 at the location corresponding to attraction posts 50 which exist in the respective zones of the top ring 1 for controlling the profile of the semiconductor wafer. Although the attraction post is not shown in FIG. 2, a plurality of attraction posts are provided in the top ring 1. As shown in FIG. 7, through-holes 7h are formed in the membrane (elastic membrane) 7 at the locations corresponding to the attraction posts 50. By connecting the attraction posts 50 to a vacuum source, the top ring 1 can attract and hold the semiconductor wafer W under vacuum. Further, when the semiconductor wafer W is dislodged from the top ring 1, a fluid is ejected from the attraction posts 50 toward the semiconductor wafer W to cause the semiconductor wafer W to come off the membrane (elastic membrane) 7. In the membrane (elastic membrane) 7 shown in FIG. 7, the torque transmission from the top ring 1 to the semiconductor wafer W is performed at a non-coating area, and the pressurized air is prevented from leaking to the outer periphery of the membrane 7 by the non-coating area.

FIGS. 8 through 11 are views showing a membrane (elastic membrane) in which an impregnation coating is applied to the areas which are arranged radially from the central part to the peripheral part of the membrane (elastic membrane). In the membranes (elastic membranes) shown in FIGS. 8 through 11, an impregnation coating 7c is applied to the areas so as to surround the attraction posts 50 in respective zones. A number of rectangular coatings are applied to the membranes (elastic membranes) 7 shown in FIGS. 8 through 11. The membrane (elastic membrane) 7 shown in FIG. 8 has a higher sealing capability with respect to the semiconductor wafer than the membrane (elastic membrane) 7 shown in FIG. 9. In the membrane (elastic membrane) 7 shown in FIG. 10, in order to enhance a releasing capability for releasing the semiconductor wafer from the membrane, a number of coated locations are increased at the outer side of the membrane 7. The membrane (elastic membrane) 7 shown in FIG. 11 has a number of sector-shaped impregnation coatings 7c, and exhibits an excellent releasing capability for releasing a semiconductor wafer as with the membrane (elastic membrane) shown in FIG. 10.

Figure 12:
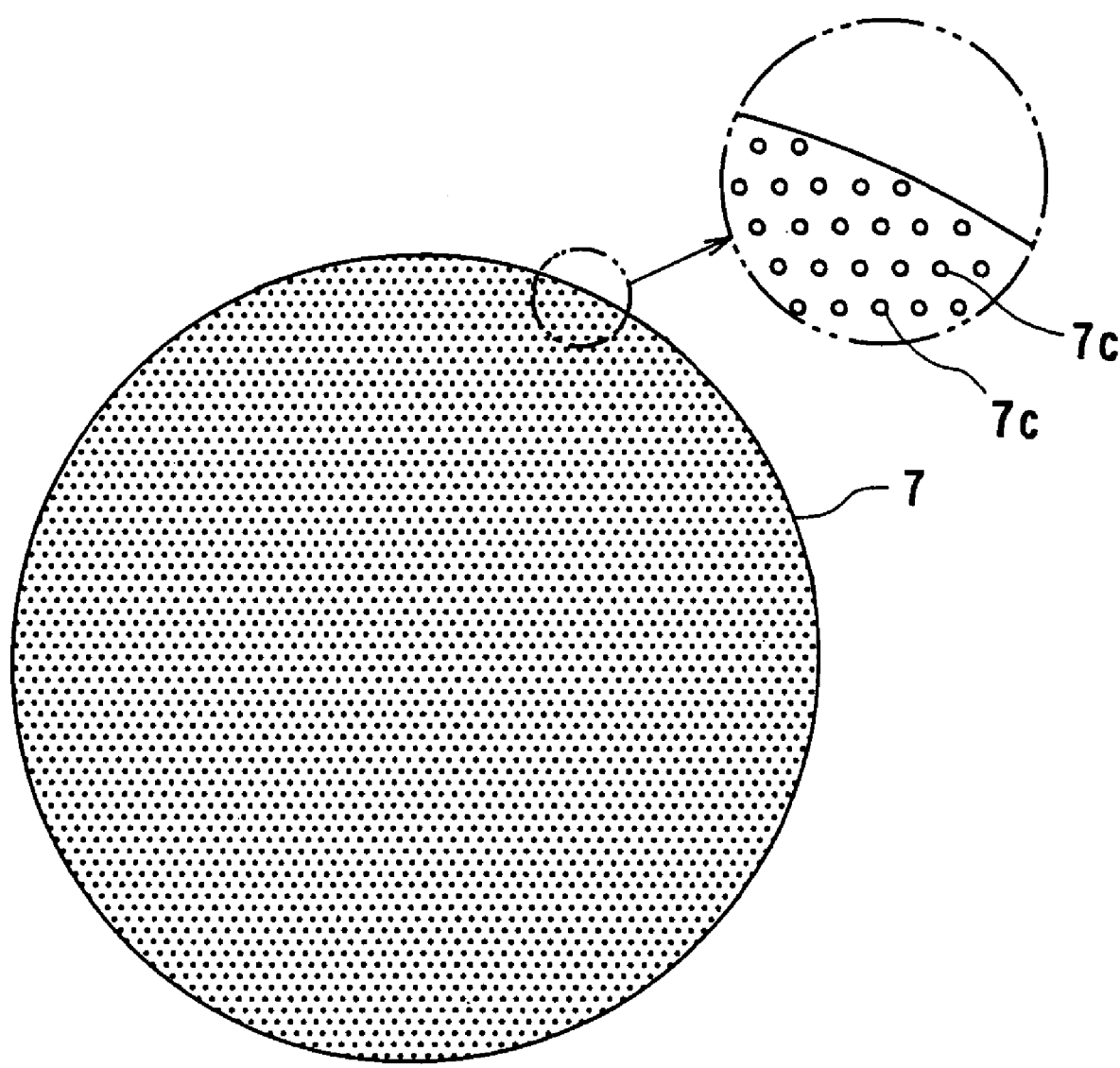
FIG. 12 is a view of a membrane (elastic membrane) in which coating spots having a predetermined diameter (for example, 1 mm) are distributed over the entire surface thereof.

FIG. 12 is a view showing a membrane (elastic membrane) in which coating spots having a predetermined diameter (for example, 1 mm) are distributed over the entire surface thereof. In the membrane (elastic membrane) 7 shown in FIG. 12, a number of spot-like impregnation coatings 7c are distributed over the entire surface of the membrane. The coatings are applied to the membrane (elastic membrane) 7 shown in FIG. 12 in the same coating method as that of FIGS. 5A and 5B. In FIG. 12, the diameter of the coating spot is enlarged in order to improve the releasing capability of the semiconductor wafer, and the distribution of the coating spots is made coarse in order to enhance the torque transmission capability of the top ring. In this manner, it is desirable to adjust distribution of the coatings according to a process condition.

Overall operation of the top ring 1 shown in FIGS. 1 and 2 will be described below.

In the polishing apparatus shown in FIGS. 1 and 2, when the semiconductor wafer W is to be supplied to the top ring 1, the top ring 1 is placed in its entirety into a position for transferring the semiconductor wafer W. The attraction posts 50 (see FIG. 7) provided at the locations corresponding to the through-holes 7h of the membrane 7 are connected to the vacuum source to attract and hold the semiconductor wafer W under vacuum. Then, the top ring 1 holding the semiconductor wafer W under vacuum is moved in its entirety to a position above the polishing table 100 having the polishing surface (the polishing pad 101). An outer circumferential edge of the semiconductor wafer W is retained by the retainer ring 3, so that the semiconductor wafer W will not be dislodged from the top ring 1.

Then, the attraction posts 50 release the semiconductor wafer W. At the same time, the top ring air cylinder 111 connected to the top ring drive shaft 11 is operated to press the retainer ring 3 fixed to the lower end of the top ring 1 against the polishing surface of the polishing table 100 (the polishing pad 101) under a predetermined pressing force. Thereafter, the pressure chamber 21 is supplied with the pressurized fluid to lower the chucking plate 6, thereby pressing the membrane 7 against the semiconductor wafer W. The lower surface of the membrane 7 is now reliably held in intimate contact with an upper surface of the semiconductor wafer W. In this state, the pressure chamber 30 is supplied with pressurized fluid under a predetermined pressure, thereby lifting the chucking plate 6 and pressing the semiconductor wafer W against the polishing surface of the polishing table 100. The polishing liquid Q which has been supplied from the polishing liquid supply nozzle 102 is retained on the polishing pad 101. The semiconductor wafer W is now polished with the polishing liquid Q being present between a surface (the lower surface) of the semiconductor wafer W and the polishing pad 101.

The pressing force applied by the top ring air cylinder 111 to press the retainer ring 3 against the polishing pad 101 and the pressing force applied by the pressurized air supplied to the pressure chamber 30 to press the semiconductor wafer W against the polishing pad 101, are appropriately adjusted to polish the semiconductor wafer W. During the polishing process, the pressing force to press the semiconductor wafer W against the polishing pad 101 of the polishing table 100 can be adjusted by the regulator R3, and the pressing force which is applied by the retainer ring 3 to press the polishing pad 101 can be adjusted by the regulator R1. Therefore, by adjusting the pressing force to press the semiconductor wafer W against the polishing pad 101 and the pressing force which is applied by the retainer ring 3 to press the polishing pad 101 properly during polishing, a distribution of polishing pressures is made continuous and uniform from the central part of the semiconductor wafer W to its peripheral edge and further to the outer circumferential edge of the retainer ring 3 disposed around the semiconductor wafer W. Consequently, the peripheral portion of the semiconductor wafer W is prevented from being polished excessively or insufficiently.

When the polishing process is finished, the supply of the pressurized fluid to the pressure chamber 30 is stopped, and the pressure chamber 30 is vented to the atmosphere. Then, a negative pressure is developed in the attraction posts 50 (see FIG. 7) to attract the semiconductor wafer W again to the lower end surface of the top ring 1 under vacuum. At this time, the pressure of the pressure chamber 21 is made an atmospheric pressure or a negative pressure. This is because if the pressure in the pressure chamber 21 remains high, the semiconductor wafer W would be locally pressed against the polishing surface by the lower surface of the chucking plate 6.

After the semiconductor wafer W is thus held under vacuum, the top ring 1 in its entirety is positioned in the transfer position for the semiconductor wafer W, and the vacuum attraction of the semiconductor wafer W by the attraction posts 50 is released. Then, the attraction posts 50 are connected to a fluid supply source and a fluid (e.g., a pressurized fluid or a mixture of nitrogen and pure water) is ejected from the attraction posts 50 to the semiconductor wafer W, thereby releasing the semiconductor wafer W from the membrane (elastic membrane) 7. When the semiconductor wafer W is released from the membrane (elastic membrane) 7, non-adhesion and sliding properties of the membrane (elastic membrane) 7 are enhanced by the impregnation coating 7c, and hence the semiconductor wafer W can be easily peeled off from the membrane (elastic membrane) 7 and can be easily released from the top ring 1.

Figure 13A:
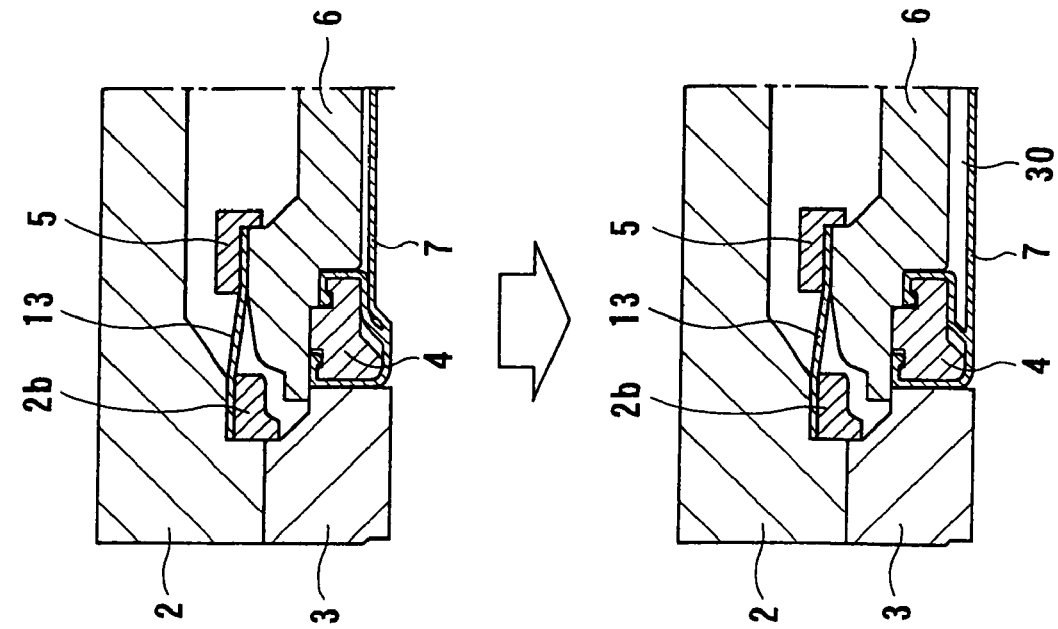
FIGS. 13A and 13B are views showing an embodiment in which an impregnation coating is applied to a backside surface of a membrane (elastic membrane)
Figure 13B:
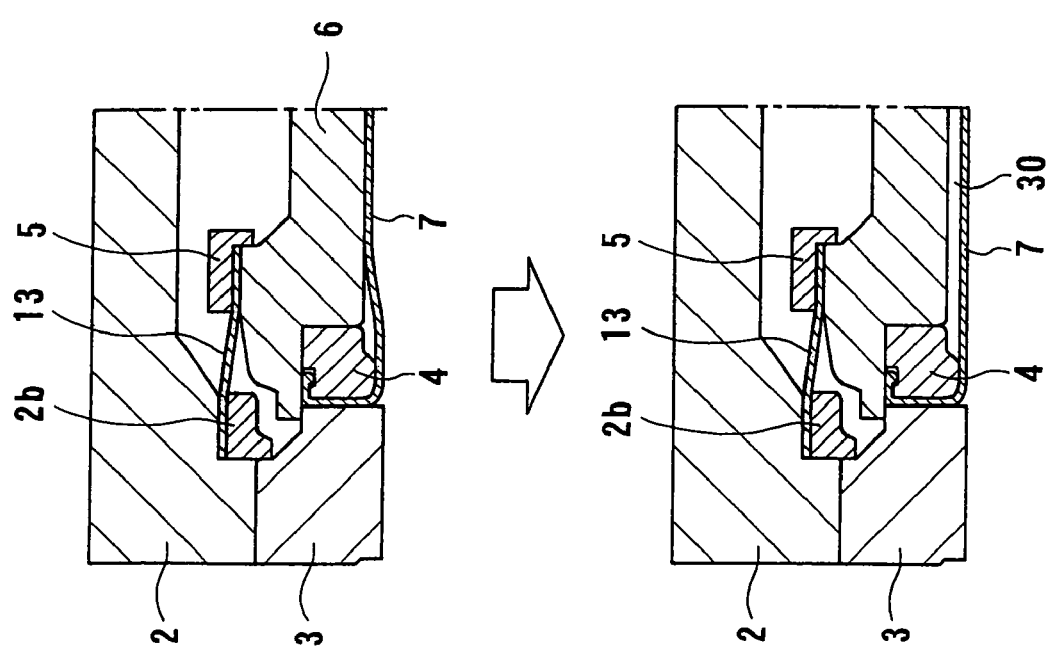

FIGS. 13A and 13B are views showing an embodiment in which an impregnation coating is applied to a backside surface of a membrane (elastic membrane). In FIGS. 13A and 13B, the upper part of these figures shows a state in which a coating is not applied to a backside surface of the membrane, and the lower part of the figures shows the state in which a coating is applied to a backside surface of the membrane. By applying the impregnation coating to the backside surface of the membrane (elastic membrane) 7 which does not contact the semiconductor wafer, slurry or dust can be prevented from being attached to the backside surface of the membrane 7. Further, as shown in FIG. 13A, the application of the coating to the backside surface of the membrane (elastic membrane) 7 prevents the membrane 7 to adhering to the chucking plate 6 during polishing. Further, as shown in FIG. 13B, the membranes (elastic membranes) 7 which face each other can be prevented from adhering to each other.

Next, a top ring according to a second embodiment of the present invention which constitutes a substrate holding apparatus will be described below with reference to FIG. 14. The top ring according to the second embodiment has a plurality of pressure chambers therein, and the pressures of a fluid such as pressurized air supplied to respective pressure chambers positioned on a reverse side of the semiconductor wafer are controlled to locally control the pressure applied to the semiconductor wafer to press the semiconductor wafer under locally different pressures.

Figure 14:
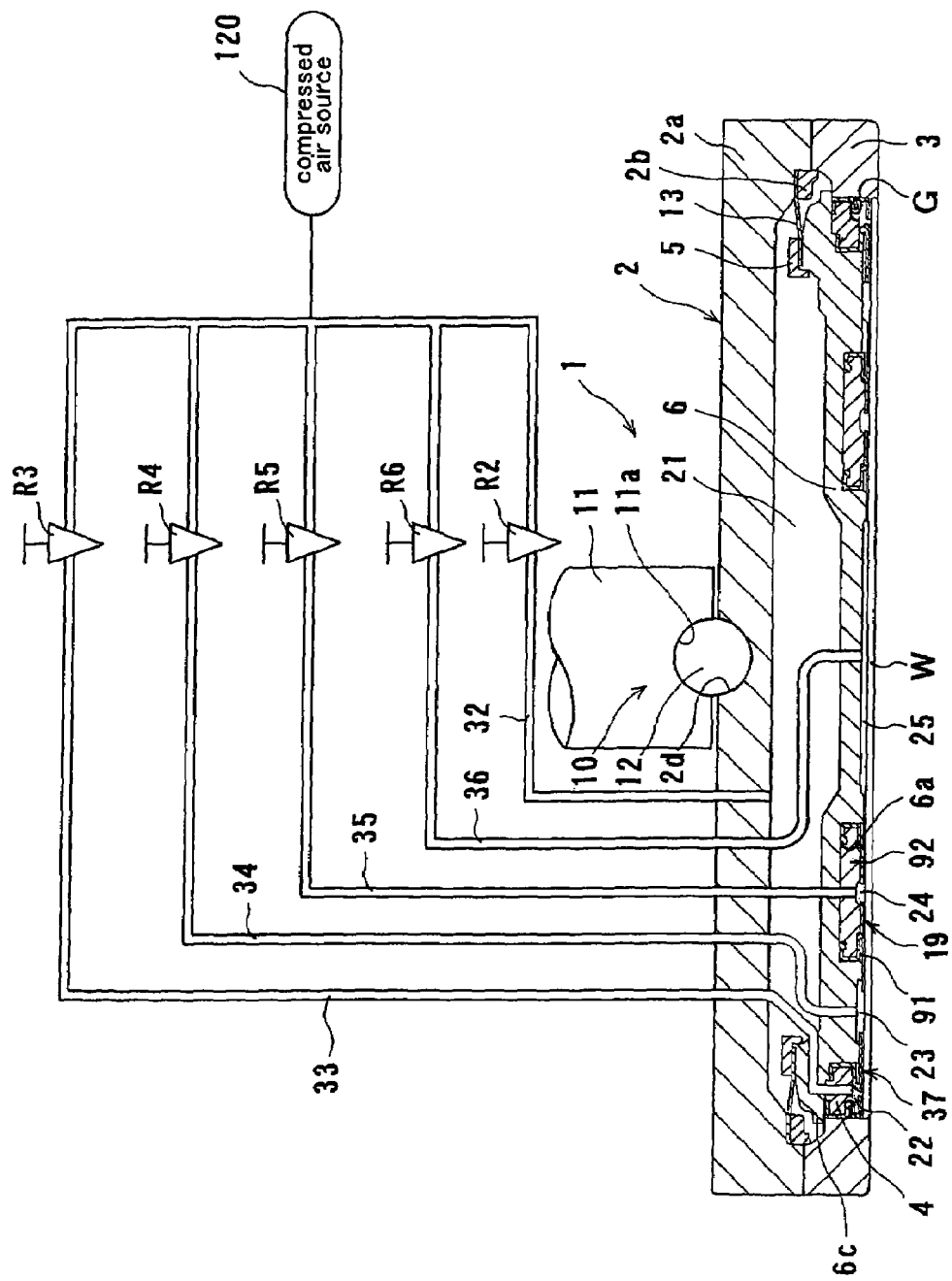
FIG. 14 is a vertical cross-sectional view of a top ring according to the second embodiment of the present invention.

As shown in FIG. 14, a retainer ring 3 is fixed to a lower end of the housing 2a of the top ring body 2. The top ring body 2 and the retainer ring 3 have a space defined therein which accommodates an annular holder ring 5 and a disk-shaped chucking plate 6 (vertically movable member) in the same manner as the top ring according to the first embodiment. Further, a pressurizing sheet 13 extends between the holder ring 5 and the top ring body 2, and the top ring body 2, the chucking plate 6, the holder ring 5, and the pressurizing sheet 13 jointly define a pressure chamber 21 in the top ring body 2 in the same manner as the first embodiment.

In the second embodiment, an annular edge membrane (elastic membrane) 37 held in contact with the outer circumference edge of the semiconductor wafer W held by the top ring 1 is mounted on an outer circumference edge of the chucking plate 6. The edge membrane 37 has an upper end sandwiched between the outer circumference edge of the chucking plate 6 and the annular edge ring 4. In this manner, the edge membrane 37 is mounted on the chucking plate 6.

As shown in FIG. 14, when the semiconductor wafer W is held by the top ring 1, a pressure chamber 22 is defined in the edge membrane 37. A fluid passage 33 comprising tubes and connectors communicates with the pressure chamber 22, and the pressure chamber 22 is connected to the compressed air source 120 through regulator R3 provided in the fluid passage 33. The edge membrane 37 is made of a highly strong and durable rubber material such as ethylene propylene rubber (EPDM), polyurethane rubber, or silicone rubber, as with the pressurizing sheet 13. The rubber material of the edge membrane 37 should preferably have a hardness (duro) ranging from 20 to 70.

When the semiconductor wafer W is polished, the semiconductor wafer W is rotated by rotation of the top ring 1. The edge membrane 37 alone has a small contact area with the semiconductor wafer W, and is liable to fail to transmit a sufficient rotational torque from the top ring 1 to the semiconductor wafer W. Therefore, an annular intermediate air bag 19 for transmitting a sufficient torque to the semiconductor wafer W is fixed to the lower surface of the chucking plate 6 so as to be held in contact with the semiconductor wafer W. The intermediate air bag 19 is disposed radially inwardly of the edge membrane 37, and held in contact with the semiconductor wafer W through a contact area large enough to transmit a sufficient torque to the semiconductor wafer W. The intermediate air bag serves to perform a profile control process.

The intermediate air bag 19 comprises an elastic membrane 91 which is brought into contact with the upper surface of the semiconductor wafer W, and an air bag holder 92 for removably holding the elastic membrane 91. The air bag holder 92 is fixedly mounted by screws (not shown) in an annular groove 6a that is defined in the lower surface of the chucking plate 6. The elastic membrane 91 constituting the intermediate air bag 19 is removably mounted on the lower surface of the chucking plate 6 by an upper end of the elastic membrane 91 which is sandwiched between the annular groove 6a and the air bag holder 92.

When the semiconductor wafer W is held by the top ring 1, a pressure chamber 24 is defined in the intermediate air bag 19 by the elastic membrane 91 and the air bag holder 92. A fluid passage 35 comprising tubes and connectors communicates with the pressure chamber 24, and the pressure chamber 24 is connected to the compressed air source 120 through the regulator R5 provided in the fluid passage 35. The elastic membrane 91 is made of a highly strong and durable rubber material, such as ethylene propylene rubber (EPDM), polyurethane rubber, or silicone rubber, as with the pressurizing sheet 13.

An annular space defined by the edge membrane 37, the intermediate air bag 19, the semiconductor wafer W, and the chucking plate 6 serves as a pressure chamber 23. A fluid passage 34 comprising tubes and connectors communicates with the pressure chamber 23, and the pressure chamber 23 is connected to the compressed air source 120 through the regulator R4 provided in the fluid passage 34.

A circular space defined by the intermediate air bag 19, the semiconductor wafer W, and the chucking plate 6 serves as a pressure chamber 25. A fluid passage 36 comprising tubes and connectors communicates with the pressure chamber 25, and the pressure chamber 25 is connected to the compressed air source 120 through the regulator R6 provided in the fluid passage 36. The fluid passages 32, 33, 34, 35 and 36 are connected to the respective regulators R2 through R6 through a rotary joint (not shown) disposed on an upper end of the top ring head 110.

Since there is a small gap G between the outer circumferential surface of the edge membrane 37 and the retainer ring 3, members including the edge ring 4, the edge membrane 37 mounted on the chucking plate 6, and the like are vertically movable with respect to the top ring body 2 and the retainer ring 3, and hence form a floating structure. The chucking plate 6 has a plurality of projections 6c projecting outwardly from its outer circumferential edge. When the projections 6c engage an upper surface of an inwardly projecting portion of the retainer ring 3, downward movement of the members including the chucking plate 6, and the like is limited to a certain position.

Figure 15A:
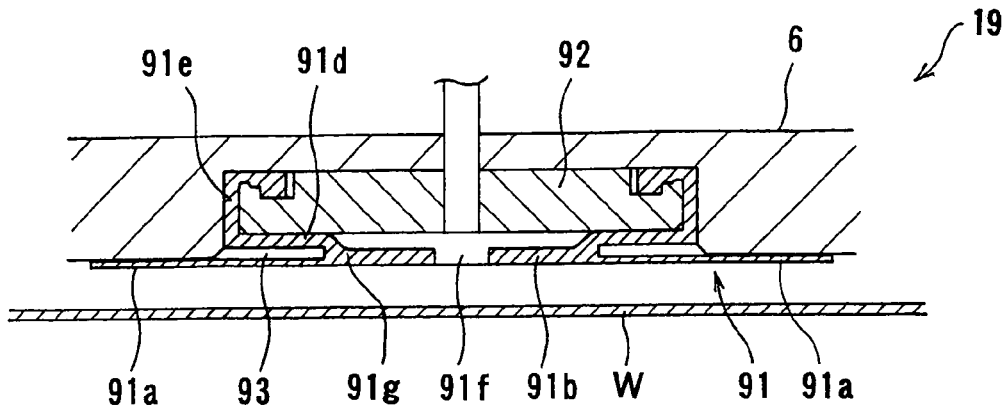
FIGS. 15A through 15C are enlarged cross-sectional views of an intermediate air bag shown in FIG. 14.
Figure 15B:
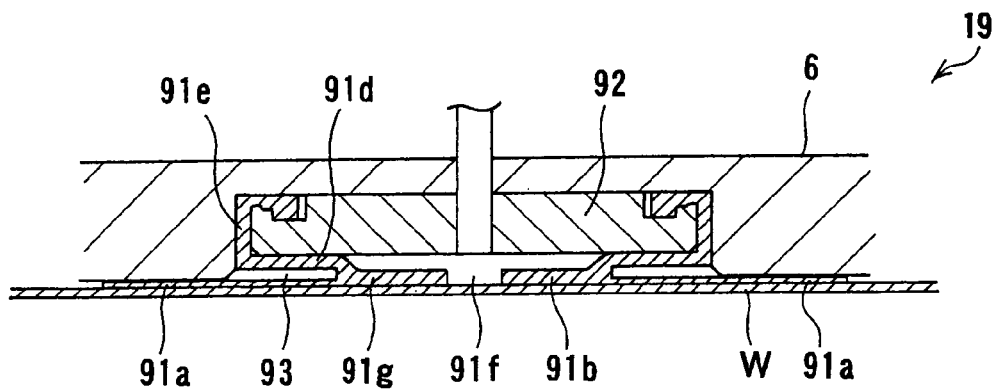
Figure 15C:
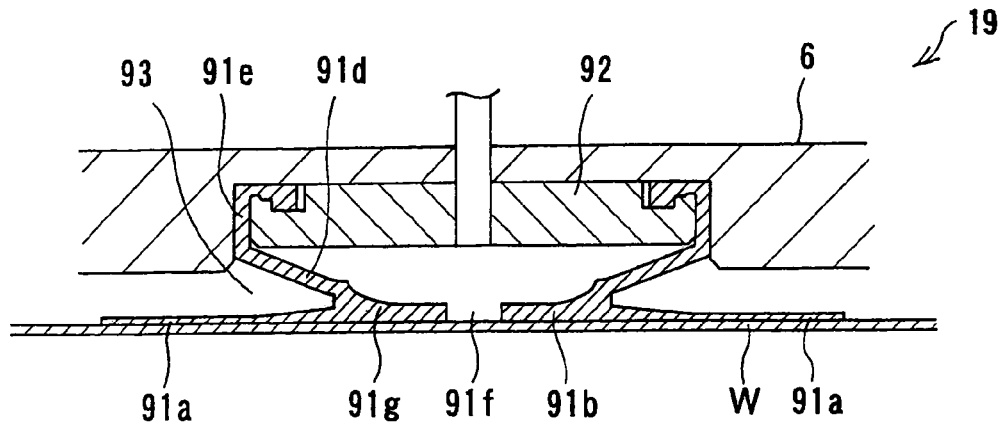

The intermediate air bag 19 will be described in detail below with reference to FIGS. 15A through 15C. FIGS. 15A through 15C are enlarged cross-sectional views showing the intermediate air bag 19 shown in FIG. 14.

As shown in FIG. 15A, the elastic membrane 91 of the intermediate air bag 19 according to the present embodiment has an intermediate contact portion 91b having a radially outwardly extending flange 91a, an extension 91d extending radially outwardly from a base 91g of the flanges 91a and defining an annular recess 93 between the extension 91d and the flange 91a, and a joint 91e jointed to the chucking plate 6 by the air bag holder 92. The extension 91d has an outer end positioned radially inwardly of the flange 91a, and the joint 91e extends upwardly from the outer end of the extension 91d. The flange 91a, the intermediate contact portion 91b, the joint 91e, and the extension 91d are integrally formed by an elastic material. The intermediate contact portion 91b has an opening 91f defined centrally therein.

With the above arrangement, when the semiconductor wafer W is polished in such a state that the chucking plate 6 is lifted upwardly after the semiconductor wafer W is brought into intimate contact with the intermediate contact portion 91b of the intermediate air bag 19 (see FIG. 15B), the upward force applied to the joint 91e is converted by the extension 91d into a horizontal or oblique force which is then applied to the base 91g of the flange 91a (see FIG. 15C). Therefore, the upward force applied to the base 91g of the flange 91a is minimized, and hence no excessive upward force is imposed on the intermediate contact portion 91b. Accordingly, no vacuum is created in the vicinity of the base 91g, and a uniform polishing rate is achieved over the entire surface of the intermediate contact portion 91b except the flange 91a. A thickness of the joint 91e and the length of the flange 91a may be of different values in their radially inward and outward regions, and the length of the extension 91d may also be of different values in its radially inward and outward regions. Furthermore, a thickness of the flange 91a may be changed depending on the type of the film to be polished on the semiconductor wafer W and the type of the polishing pad used. If the resistance and polishing torque transmitted to the semiconductor wafer W are large, then the flange 91a should preferably be made thick in order to prevent itself from being twisted.

Figure 16A:
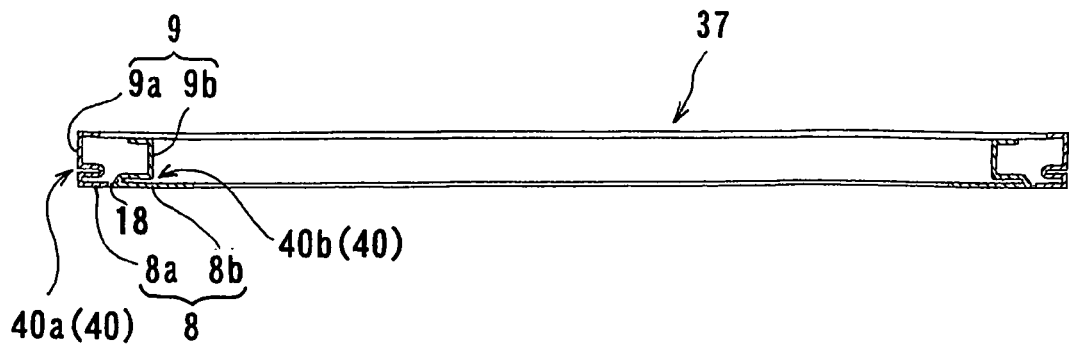
FIG. 16A is a cross-sectional view showing an overall arrangement of an edge membrane according to the second embodiment of the present invention.

The edge membrane 37 will be described in detail below with reference to FIGS. 16A through 16C. FIG. 16A is a cross-sectional view showing an entire arrangement of the edge membrane according to the present embodiment, and FIGS. 16B and 16C are fragmentary cross-sectional views of the substrate holding apparatus shown in FIG. 14.

The edge membrane (elastic member) 37 according to the present embodiment has an annular contact portion 8 for contacting an outer circumferential edge of the semiconductor wafer W, and an annular circumferential wall 9 extending upwardly from the contact portion 8 and connected to the chucking plate 6. The circumferential wall 9 comprises an outer circumferential wall 9a and an inner circumferential wall 9b disposed radially inwardly of the outer circumferential wall 9a. The contact portion 8 has a shape extending radially inwardly from the circumferential wall 9 (the outer circumferential wall 9a and the inner circumferential wall 9b). The contact portion 8 has a circumferentially extending slit 18 defined in a portion thereof which is positioned between the outer circumferential wall 9a and the inner circumferential wall 9b. The slit 18 divides the contact portion 8 into an outer contact portion 8a and an inner contact portion 8b between the outer circumferential wall 9a and the inner circumferential wall 9b.

Figure 16B:
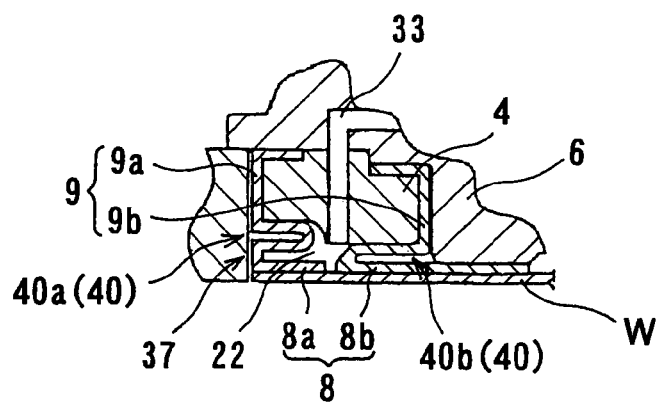
FIGS. 16B and 16C are fragmentary cross-sectional views of the substrate holding apparatus shown in FIG. 14.
Figure 16C:
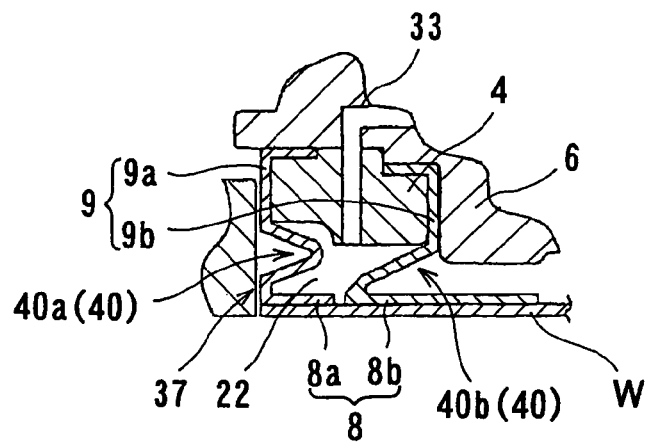

As shown in FIGS. 16B and 16C, the outer circumferential wall 9a and the inner circumferential wall 9b extend upwardly along outer and inner circumferential surfaces, respectively, of the annular edge ring 4, and have respective upper ends sandwiched between the chucking plate 6 and the upper surface of the edge ring 4. The edge ring 4 is fastened to the chucking plate 6 by screws (not shown), so that the edge membrane 37 is removably attached to the chucking plate 6. The fluid passage 33 extends vertically through the edge ring 4 and is open at the lower surface of the edge ring 4. Therefore, the annular pressure chamber 22 defined by the edge ring 4, the edge membrane 37, and the semiconductor wafer W communicates with the fluid passage 33, and is connected to the compressed air source 120 through the fluid passage 33 and the regulator R3 (shown in FIG. 14).

The circumferential wall 9 has a stretchable and contractible portion 40 which is stretchable and contractible substantially perpendicularly to the semiconductor wafer W. More specifically, the outer circumferential wall 9a of the circumferential wall 9 has a vertically stretchable and contractible portion 40a, and the stretchable and contractible portion 40a has such a structure that a portion of the outer circumferential wall 9a is folded inwardly along the circumferential direction and then folded back outwardly. The stretchable and contractible portion 40a is positioned near the outer contact portion 8a and located in a position below the edge ring 4. The inner circumferential wall 9b of the circumferential wall 9 also has a vertically stretchable and contractible portion 40b, and the stretchable and contractible portion 40b has such a structure that a portion of the inner circumferential wall 9b near its lower end is folded inwardly along the circumferential direction. With the stretchable and contractible portions 40a, 40b disposed respectively in the outer circumferential wall 9a and the inner circumferential wall 9b, the outer circumferential wall 9a and the inner circumferential wall 9b can largely be stretched and contracted while the contact portion 8 (the outer contact portion 8a and the inner contact portion 8b) is maintained in terms of shape. Therefore, as shown in FIG. 16C, when the chucking plate 6 is elevated, the stretchable and contractible portions 40a, 40b are stretched so as to follow the movement of the chucking plate 6, thereby keeping a contact area of the edge membrane 37 and the semiconductor wafer W constant.

The pressure chamber 21 defined above the chucking plate 6 and the pressure chambers 22, 23, 24 and 25 defined below the chucking plate 6 are supplied with a pressurized fluid such as pressurized air or the like, or are vented to the atmospheric pressure, or are evacuated to develop a vacuum therein, through the fluid passage 32, 33, 34, 35 and 36 communicating respectively with these pressure chambers. Specifically, the regulators R2 through R6 in the fluid passages 32 through 36 can regulate the pressures of the pressurized fluid that is supplied to the pressure chambers 21 through 25. Therefore, pressures in the pressure chambers 21 through 25 can be controlled independently of each other, or the pressure chambers 21 through 25 can be vented to atmospheric pressure or evacuated to develop a vacuum therein.

In the top ring 1 according to the second embodiment shown in FIGS. 14 through 16A, 16B and 16C, when the semiconductor wafer W is released from the top ring 1 after polishing of the semiconductor wafer W is finished, a pressurized fluid is supplied to the pressure chamber 24 to pressurize the intermediate air bag 19, and the semiconductor wafer W is detached from the elastic membrane 91. At this time, the flange 91a of the elastic membrane 91 tends not to be detached from the semiconductor wafer W. Thus, according to the second embodiment, non-adhesion and sliding properties of the elastic membrane are enhanced by applying the impregnation coating to the flange 91a of the elastic membrane 91, whereby the semiconductor wafer W is easy to be detached from the elastic membrane.

Figure 17A:
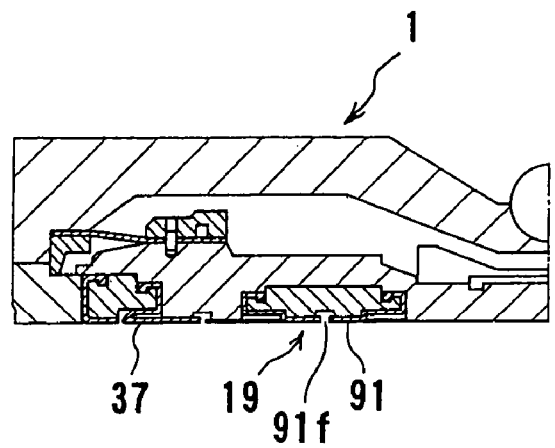
FIGS. 17A and 17B are views showing an elastic membrane to which an impregnation coating is applied.
Figure 17B:
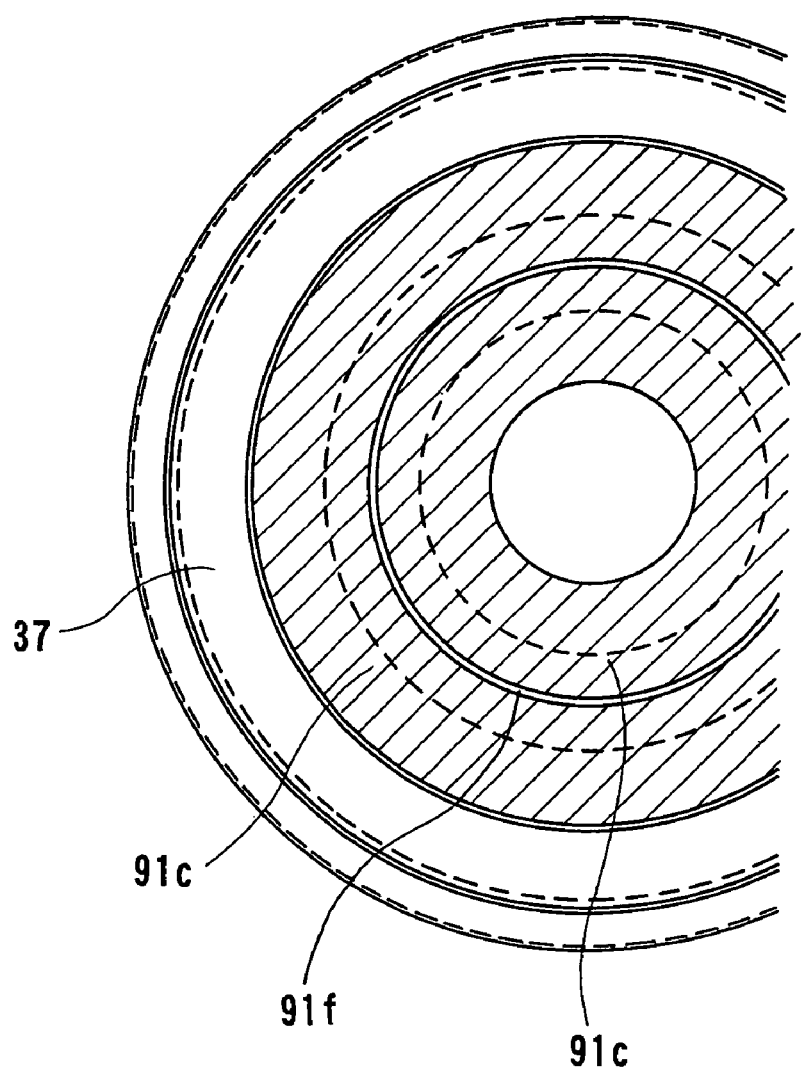
Figure 18A:
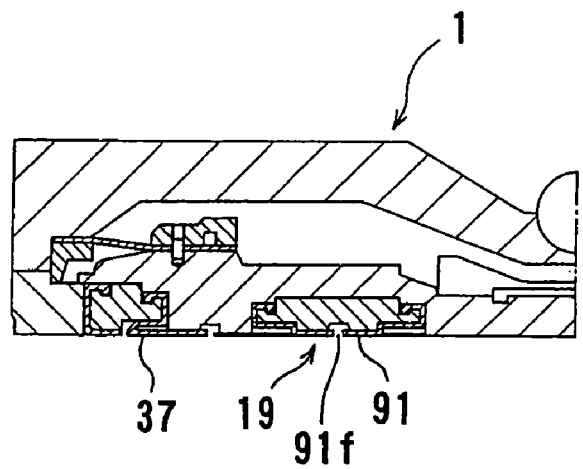
FIGS. 18A and 18B are views showing an elastic membrane to which an impregnation coating is applied.
Figure 18B:
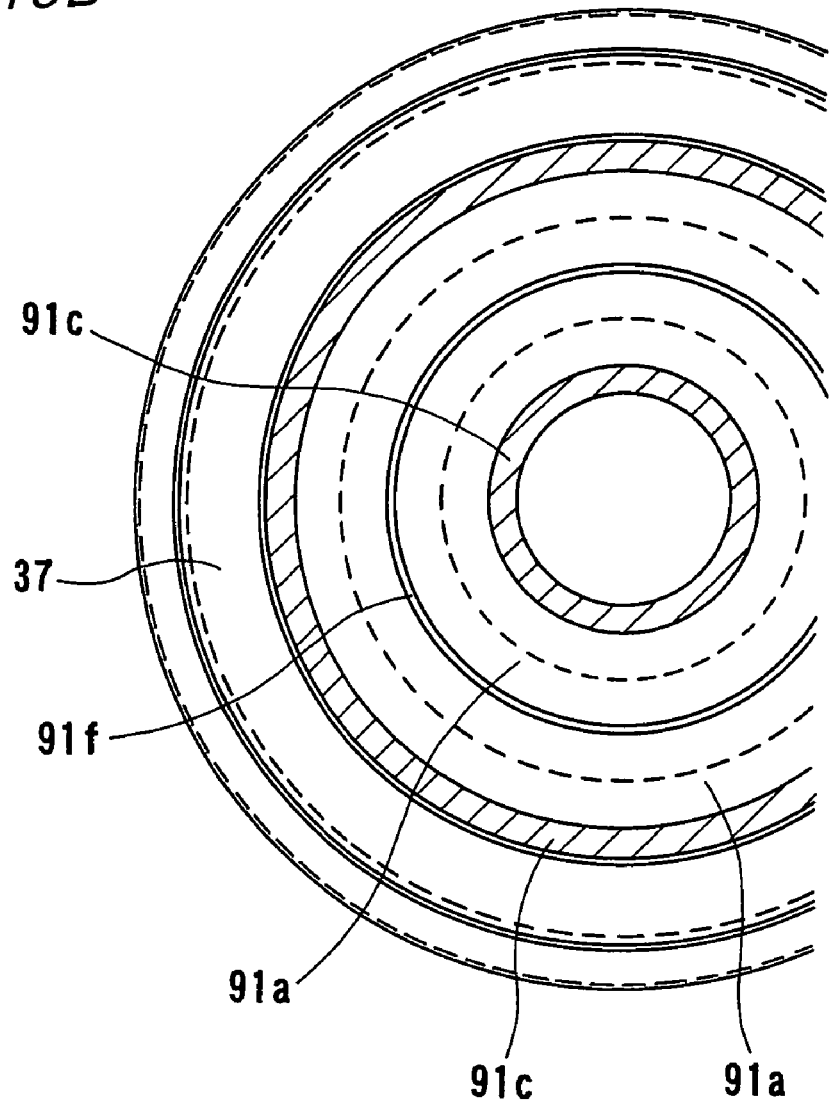
Figure 19A:
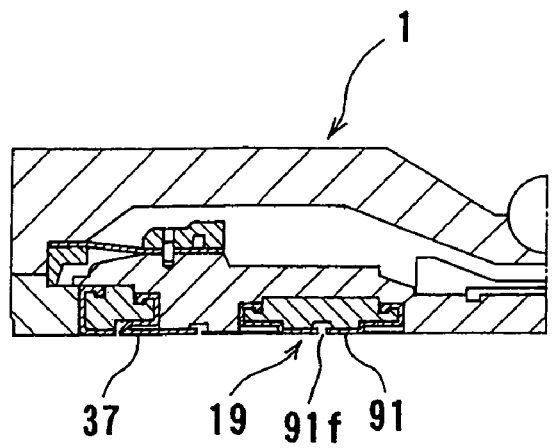
FIGS. 19A and 19B are views showing an elastic membrane to which an impregnation coating is applied.
Figure 19B:
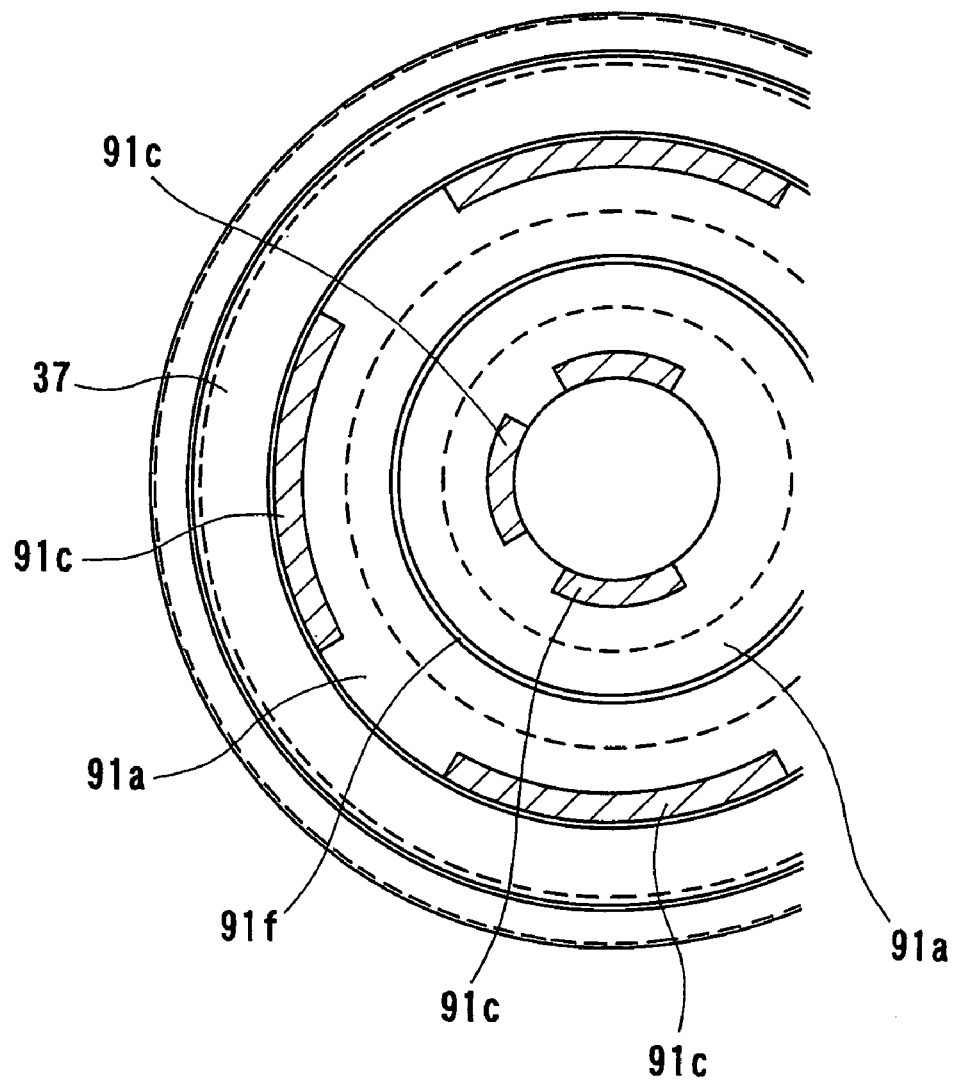

FIGS. 17A and 17B through 19A and 19B are views showing an elastic membrane to which an impregnation coating is applied, and FIGS. 17A, 18A and 19A are enlarged cross-sectional views of a top ring and FIG. 17B, 18B and 19B are bottom plan views showing the top ring incorporating an intermediate air bag 19 comprising an elastic membrane 91 to which an impregnation coating 91c is applied.

In the example shown in FIGS. 17A and 17B, the impregnation coating 91c is applied to the surface of the elastic membrane 91 of intermediate air bag 19 which is brought into contact with the semiconductor wafer W. Thus, when the semiconductor wafer W is released from the top ring 1, the semiconductor wafer W is easy to be detached from the elastic membrane 91. In the example shown in FIGS. 18A and 18B, annular impregnation coatings 91c are applied to the outer circumferential side and the inner circumferential side of the flange 91a of the elastic membrane 91. With this arrangement, a releasing capability of the semiconductor wafer W and the sealing capability of the semiconductor wafer W can be obtained in the intermediate air bag 19. In the example shown in FIGS. 19A and 19B, sector-shaped impregnation coatings 91c are applied only to the outer circumferential side and the inner circumferential side of t flange 91a of the elastic membrane 91 at equal intervals in a circumferential direction of the elastic membrane 91. Therefore, a sealing capability of the semiconductor wafer W in the embodiment shown in FIGS. 19A and 19B is higher than that in the embodiment shown in FIGS. 18A and 18B. Since the coating is not applied to the regions surrounding the opening (annular cutout) 91f in the embodiment shown in FIGS. 18A, 18B, 19A and 19B, a sealing capability between the semiconductor wafer W and the elastic membrane during polishing is excellent.

Overall operation of the top ring 1 shown in FIGS. 14 through 19A and 19B will be described below.

When semiconductor wafer W is to be supplied to the top ring 1, the top ring 1 is placed in its entirety into a position for transferring the semiconductor wafer W. The pressure chamber 23 and/or the pressure chamber 24 is connected to a vacuum source through the fluid passage 34 and/or the fluid passage 35, and is evacuated to develop a vacuum therein. The pressure chamber 23 and/or the pressure chamber 24 now attracts the semiconductor wafer W under vacuum to the lower surface of the top ring 1. Then, the top ring 1 holding the semiconductor wafer W under vacuum is moved in its entirety to a position above the polishing table 100 having the polishing surface (the polishing pad 101).

The outer circumferential edge of the semiconductor wafer W is retained by the retainer ring 3, so that the semiconductor wafer W will not be dislodged from the top ring 1.

Then, the pressure chamber 23 and/or the pressure chamber 24 release the semiconductor wafer W. At the same time, the top ring air cylinder 111 connected to the top ring drive shaft 11 is operated to press the retainer ring 3 fixed to the lower end of the top ring 1 against the polishing surface (the polishing pad 101) of the polishing table 100 under a predetermined pressing force. Thereafter, the pressure chamber 21 is supplied with pressurized fluid to lower the chucking plate 6, thereby pressing the edge membrane 37 and the intermediate air bag 19 against the semiconductor wafer W. The lower surfaces of the edge membrane 37 and the intermediate air bag 19 are now reliably held in intimate contact with the upper surface of the semiconductor wafer W. In this state, the pressure chambers 22 through 25 are supplied with pressurized fluid under respective pressures, thereby lifting the chucking plate 6 and pressing the semiconductor wafer W against the polishing surface of the polishing table 100. At this time, since the stretchable and contractible portions 40a, 40b of the edge membrane 37 are stretched so as to follow the upward movement of the chucking plate 6, the lower surface (the contact portion 8) of the edge membrane 37 is held against the outer circumferential edge of the semiconductor wafer W in a constant contact area. The polishing liquid Q which has been supplied from the polishing liquid supply nozzle 102 is retained on the polishing pad 101. The semiconductor wafer W is now polished with the polishing liquid Q being present between the surface (the lower surface) of the semiconductor wafer W and the polishing pad 101.

With the top ring (substrate holding apparatus) 1 according to the second embodiment, since the area in which the edge membrane 37 and the outer circumferential edge of the semiconductor wafer W contact each other is kept constant, a pressing force imposed on the outer circumferential edge of the semiconductor wafer W is prevented from changing. Therefore, the entire surface of the semiconductor wafer W, including its outer circumferential edge, can be pressed against the polishing surface under a uniform pressing force. As a result, the polishing rate on the outer circumferential edge of the semiconductor wafer W is prevented from being lowered, and the polishing rate in a region that is positioned radially inwardly of the outer circumferential edge of the semiconductor wafer W is prevented from being locally increased. Specifically, if the semiconductor wafer has a diameter of 200 mm, then the polishing rate in a region that is positioned about 20 mm from the outer periphery of the semiconductor wafer W is prevented from being increased, and if the semiconductor wafer has a diameter of 300 mm, then the polishing rate in a region that is positioned about 25 mm from the outer periphery of the semiconductor wafer W is prevented from being increased.

The circumferentially extending slit 18 defined in the contact portion 8 of the edge membrane 37 is effective to increase the stretchability of the circumferential wall 9 (the outer circumferential wall 9a and the inner circumferential wall 9b) in a downward direction. Therefore, even when the pressure of the fluid supplied to the pressure chamber 22 is reduced, a range of contact between the edge membrane 37 and the semiconductor wafer W is kept proper, thus allowing the semiconductor wafer W to be pressed under a smaller pressing force.

Regions of the semiconductor wafer W which are positioned respectively underneath the pressure chambers 22, 23, 24 and 25 are pressed against the polishing surface under the pressures of the pressurized fluid supplied to the respective pressure chambers 22, 23, 24 and 25. Therefore, by controlling the pressures of the pressurized fluid supplied to the respective pressure chambers 22, 23, 24 and 25, the entire surface of the semiconductor wafer W can be pressed against the polishing surface under a uniform force, thereby achieving a uniform polishing rate over the entire surface of the semiconductor wafer W. Similarly, the pressure of the pressurized fluid supplied to the pressure chamber 21 can be regulated by the regulator R2 to change the pressing force for pressing the retainer ring 3 against the pressing pad 101. In this manner, the polishing profile of the semiconductor wafer W can be controlled by appropriately regulating the pressing force for pressing the retainer ring 3 against the pressing pad 101 and the pressing force for pressing the semiconductor wafer W against the polishing pad 101 with the pressure chambers 22, 23, 24 and 25 while the semiconductor wafer W is being polished. The semiconductor wafer W has a region to which the pressing force is applied from the fluid through the contact portion of the intermediate air bag 19, and a region to which the pressure of the pressurized fluid is directly applied. The pressing forces applied to these regions of the semiconductor wafer W are identical to each other.

As described above, the pressing force for pressing the retainer ring 3 against the polishing pad 101 by the top ring air cylinder 111 and the pressing force for pressing the semiconductor wafer W against the polishing pad 101 with the pressurized fluid supplied to the respective pressure chambers 22, 23, 24 and 25 are appropriately regulated to polish the semiconductor wafer W.

When the polishing process is finished, the supply of the pressurized fluid to the pressure chambers 22, 23, 24 and 25 is stopped, and the pressure chambers 22, 23, 24 and 25 are vented to the atmosphere. Then, a negative pressure is developed in the pressure chamber 23 and/or the pressure chamber 24 to attract the semiconductor wafer W again to the lower end surface of the top ring 1 under vacuum. At this time, the pressure of the pressure chamber 21 is made to be atmospheric pressure or a negative pressure. This is because if the pressure in the pressure chamber 21 remains high, the semiconductor wafer W would be locally pressed against the polishing surface by the lower surface of the chucking plate 6.

After the semiconductor wafer W is thus held under vacuum, the top ring 1 in its entirety is positioned in the transfer position for the semiconductor wafer W, and the vacuum attraction of the semiconductor wafer W by the pressure chamber 23 and/or the pressure chamber 24 is released. Then, a fluid (e.g., a pressurized fluid or a mixture of nitrogen and pure water) is ejected from the fluid passage 35 to the semiconductor wafer W through the pressure chamber 24, thereby removing the semiconductor wafer W from the top ring 1. Since the impregnation coating 91c is applied to the elastic membrane 91 of the intermediate air bag 19, non-adhesion and sliding properties of the elastic membrane are enhanced, the semiconductor wafer W can be easily detached from the elastic membrane, and hence the semiconductor wafer W can be easily released from the top ring 1.

While embodiments of the present invention has been described above, the present invention is not limited to the above embodiment, but may be embodied in various different forms within the scope of the technical idea thereof.

As described above, according to the present invention, since a coating is applied to a surface, which contacts a substrate, of the elastic membrane for pressing the substrate against a polishing surface during polishing, non-adhesion and sliding properties of the elastic membrane are enhanced. When the substrate is released from the substrate holding apparatus after polishing of the substrate is finished, the substrate can be easily detached from the elastic membrane, and the substrate can be reliably removed from the substrate holding apparatus.

What is claimed is:

1. A substrate holding apparatus for holding a substrate and pressing the substrate against a polishing surface, comprising:
    a vertically movable top ring body for holding the substrate; and
    an elastic membrane for defining a pressure chamber in said top ring body, said elastic membrane having a cutout therein,
    wherein a coating is applied to a surface of said elastic membrane which is to be brought into contact with the substrate, with said coating not being applied to a portion surrounding said cutout.

2. A substrate holding apparatus for holding a substrate and pressing the substrate against a polishing surface, comprising:
    a vertically movable top ring body for holding the substrate; and
    an elastic membrane for defining a pressure chamber in said top ring body,
    wherein a coating is applied to a surface of said elastic membrane which is to be brought into contact with the substrate, with said coating not being applied to an outermost circumferential portion of said elastic membrane or a portion close to said outermost circumferential portion.

3. A substrate holding apparatus for holding a substrate and pressing the substrate against a polishing surface, comprising:
    a vertically movable top ring body for holding the substrate; and
    an elastic membrane for defining a pressure chamber in said top ring body, the pressure chamber being divided into plural annular pressure chambers, and said elastic membrane comprising plural annular elastic membranes for covering the plural annular pressure chambers,
    wherein a coating is applied to a surface of said elastic membrane which is to be brought into contact with the substrate.

4. The substrate holding apparatus according to claim 3, wherein
    of said plural annular elastic membrane, said coating is not applied to said annular elastic membrane located at an outer circumferential side of said top ring body, and said coating is applied to said annular elastic membrane located at an inner circumferential side of said top ring body.

5. The substrate holding apparatus according to claim 3, wherein
    said surface of said elastic membrane which is to be brought into contact with the substrate comprises a first surface of said elastic membrane, and
    said coating is also applied to a second surface of said elastic membrane, which is not to be brought into contact with the substrate, with said first surface and said second surface facing in opposite directions.

6. The substrate holding apparatus according to claim 3, wherein said coating comprises a fluororesin film.

7. The substrate holding apparatus according to claim 3, wherein said coating comprise an impregnation coating.

8. A polishing apparatus comprising:
    a polishing table having a polishing surface, and
    a substrate holding apparatus for holding a substrate and pressing the substrate against said polishing surface, said substrate holding apparatus including
        (i) a vertically movable top ring body for holding the substrate, and
        (ii) an elastic membrane for defining a pressure chamber in said top ring body, said elastic membrane having a cutout therein,
    wherein a coating is applied to a surface of said elastic membrane which is to be brought into contact with the substrate, with said coating not being applied to a portion surrounding said cutout.

9. The polishing apparatus according to claim 8, wherein said polishing surface comprises a polishing pad or a fixed abrasive.

10. A polishing apparatus comprising:
    a polishing table having a polishing surface; and
    a substrate holding apparatus for holding a substrate and pressing the substrate against said polishing surface, said substrate holding apparatus including
        (i) a vertically movable top ring body for holding the substrate, and
        (i) an elastic membrane for defining a pressure chamber in said top ring body,
    wherein a coating is applied to of said elastic membrane which is to be brought into contact with the substrate, with said coating not being applied to an outermost circumferential portion of said elastic membrane or a portion close to said outermost circumferential portion.

11. The polishing apparatus according to claim 10, wherein said polishing surface comprises a polishing pad or a fixed abrasive.

12. A polishing apparatus comprising:
    a polishing table having a polishing surface; and
    a substrate holding apparatus for holding a substrate and pressing the substrate against said polishing surface, said substrate holding apparatus including
        (i) a vertically movable top ring for holding the substrate, and
        (ii) an elastic membrane for defining a pressure chamber in said top ring body, the pressure chamber being divided into plural annular chambers, and said elastic membrane comprising plural annular elastic membranes for covering the plural annular pressure chambers,
    wherein a coating is applied to a surface of said elastic membrane which is to be brought into contact with the substrate.

13. The polishing apparatus according to claim 12, wherein
    of said plural annular elastic membranes, said coating is not applied to said annular elastic membrane located at an outer circumferential side top ring body, and said coating is applied to said annular elastic membrane located at an inner circumferential side of said top ring body.

14. The polishing apparatus according to claim 12, wherein
    said surface of said elastic membrane which is to be brought into contact with the substrate comprises a first of surface of said elastic membrane, and said coating is also applied to a second surface of said elastic membrane, which is not to be brought into contact with the substrate, with said first surface and said second surface facing in opposite directions.

15. The polishing apparatus according to claim 12, wherein said coating comprising a fluororesin film.

16. The polishing apparatus according to claim 12, wherein said coating comprises an impregnation coating.

17. The polishing apparatus according to claim 12, wherein said polishing surface comprises a polished pad or a fixed abrasive.

* * * * *

UNITED STATES PATENT AND TRADEMARK OFFICE
CERTIFICATE OF CORRECTION

PATENT NO. : 7,108,592 B2 Page 1 of 1
APPLICATION NO. : 10/874317
DATED : September 19, 2006
INVENTOR(S) : Koichi Fukaya et al.

It is certified that error appears in the above-identified patent and that said Letters Patent is hereby corrected as shown below:

Claim 12
Column 20, line 43, change "ring for" to --ring body for--; column 20, line 47, change "annular chambers" to --annular pressure chambers--.

Signed and Sealed this

Thirteenth Day of February, 2007

JON W. DUDAS
*Director of the United States Patent and Trademark Office*